(12) United States Patent
Wang et al.

(10) Patent No.: US 10,777,518 B1
(45) Date of Patent: Sep. 15, 2020

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Chuei-Tang Wang, Taichung (TW); Chen-Hua Yu, Hsinchu (TW); Tzu-Chun Tang, Kaohsiung (TW); Chieh-Yen Chen, Taipei (TW); Che-Wei Hsu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/413,614

(22) Filed: May 16, 2019

(51) Int. Cl.
| | |
|---|---|
| *H01L 23/66* | (2006.01) |
| *H01L 23/31* | (2006.01) |
| *H01L 23/29* | (2006.01) |
| *H01L 23/367* | (2006.01) |
| *H01L 23/538* | (2006.01) |
| *H01L 23/00* | (2006.01) |
| *H01L 21/48* | (2006.01) |

(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 23/295* (2013.01); *H01L 23/3128* (2013.01); *H01L 23/3135* (2013.01); *H01L 23/3672* (2013.01); *H01L 23/5383* (2013.01); *H01L 23/5386* (2013.01); *H01L 23/5389* (2013.01); *H01L 24/19* (2013.01); *H01L 24/20* (2013.01); *H01P 3/20* (2013.01); *H01Q 1/2283* (2013.01); *H01Q 19/06* (2013.01); *H01Q 21/061* (2013.01); *H01L 2223/6627* (2013.01); *H01L 2223/6677* (2013.01); *H01L 2224/214* (2013.01)

(58) Field of Classification Search
CPC ... H01L 23/66; H01L 23/295; H01L 23/5389; H01L 23/3128; H01L 23/5383; H01L 23/3672; H01L 23/3135; H01L 23/5386; H01L 21/565; H01L 21/568; H01L 24/20; H01L 24/19; H01Q 21/061
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Ahmed N Sefer
(74) *Attorney, Agent, or Firm* — JCIPRNET

(57) ABSTRACT

A package structure includes a plurality of sub-package structures, a second encapsulant, a second RDL structure and a second conductive terminal. The sub-package structure includes a die, first TIVs, a first encapsulant and an antenna element. The die has a first side and a second side. The first TIVs are laterally aside the die. The first encapsulant encapsulates sidewalls of the die and sidewalls of the TIVs. The antenna element is on the first side of the die, and on the TIVs and the first encapsulant. The second encapsulant encapsulates sidewalls of the sub-package structures. The second RDL structure is electrically connected to the plurality of sub-package structures. The second conductive terminal is electrically connected to the sub-package structures through the second RDL structure.

20 Claims, 28 Drawing Sheets

(51) Int. Cl.
  *H01L 21/56* (2006.01)
  *H01P 3/20* (2006.01)
  *H01Q 21/06* (2006.01)
  *H01Q 1/22* (2006.01)
  *H01Q 19/06* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0062439 A1* | 3/2012 | Liao ............ H01L 23/481 343/841 |
| 2013/0105966 A1* | 5/2013 | Kelkar ............ H01L 24/19 257/737 |
| 2015/0179616 A1* | 6/2015 | Lin ............ H01L 25/50 257/773 |
| 2015/0262909 A1* | 9/2015 | Chen ............ H01L 21/76804 257/774 |
| 2015/0287700 A1* | 10/2015 | Yu ............ H01L 23/5386 257/774 |
| 2016/0359221 A1* | 12/2016 | Chih ............ H01Q 1/2283 |
| 2017/0047308 A1* | 2/2017 | Ho ............ H01L 23/5386 |
| 2017/0077073 A1* | 3/2017 | Lin ............ H01L 25/105 |
| 2017/0084596 A1* | 3/2017 | Scanlan ............ H01L 25/50 |
| 2017/0098629 A1* | 4/2017 | Liu ............ H01L 24/94 |
| 2017/0263518 A1* | 9/2017 | Yu ............ H01L 24/16 |
| 2018/0012863 A1* | 1/2018 | Yu ............ G06K 9/00006 |
| 2018/0026067 A1* | 1/2018 | Lee ............ H01L 27/14634 257/777 |
| 2018/0076184 A1* | 3/2018 | Chen ............ H01L 25/50 |
| 2018/0122774 A1* | 5/2018 | Huang ............ H01L 21/56 |
| 2018/0247905 A1* | 8/2018 | Yu ............ H01L 23/3128 |
| 2018/0269139 A1* | 9/2018 | Chiang ............ H01L 21/6835 |

* cited by examiner

PACKAGE STRUCTURE AND METHOD OF MANUFACTURING THE SAME

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1K are schematic cross-sectional views illustrating a method of forming a package structure according to a first embodiment of the disclosure.

DETAILED DESCRIPTION

Figure 1A:
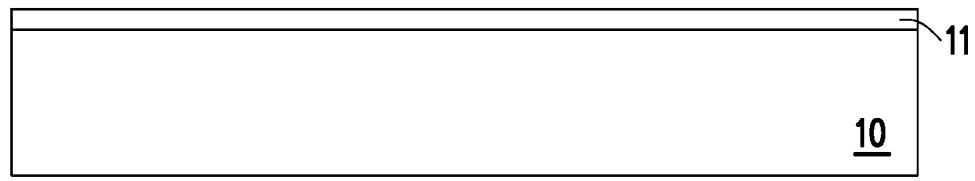

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a method of forming a package structure (having antenna) according to a first embodiment of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

Figure 1B:
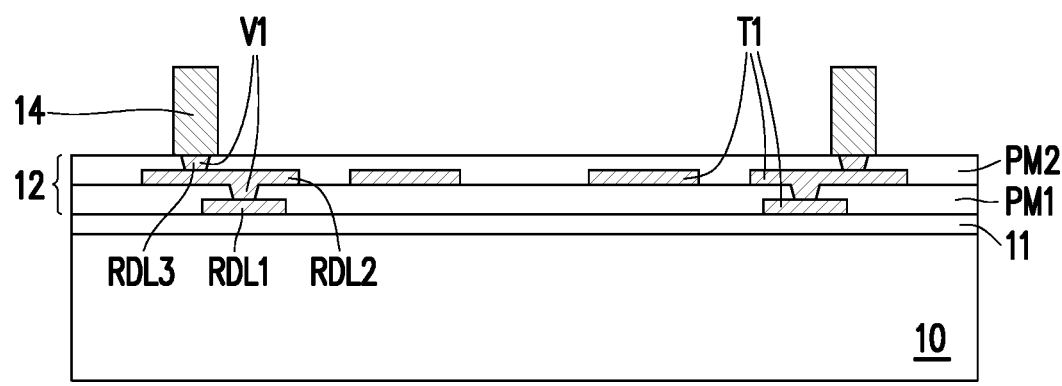

Referring to FIG. 1B, a redistribution layer (RDL) structure 12 is formed over the carrier 10. The RDL structure 12 includes a plurality of redistribution layers formed in polymer layers, and the redistribution layers are electrically interconnected to each other. In some embodiments, the RDL structure 12 includes the polymer layers PM1, PM2 and the redistribution layers RDL1, RDL2, RDL3 stacked alternately. The number of the polymer layers or the redistribution layers is not limited by the disclosure. The number of the polymer layers may be the same as or different from the number of the redistribution layers.

In some embodiments, the redistribution layer RDL1 is embedded in and penetrates through the polymer layer PM1, and the bottom surface of the redistribution layer RDL1 is exposed and substantially level with the bottom surface of the polymer layer PM1, and are in contact with the de-bonding layer 11. The redistribution layer RDL2 penetrates through the polymer layer PM1 and is electrically connected to the redistribution layer RDL1. The redistribution layer RDL3 penetrates through the polymer layer PM2 and is electrically connected to the redistribution layer RDL2.

In some embodiments, the top surface of the redistribution layer RDL3 may be substantially level with the top surface of the polymer layer PM2, but the disclosure is not limited thereto. In some other embodiments, the redistribution layer RDL3 protrudes from the top surface of the polymer layer PM2, that is, the top surface of the redistribution layer RDL3 is higher than the top surface of the polymer layer PM2.

In some embodiments, the RDL structure 12 includes a plurality of vias V1 and a plurality of traces T1 connected to each other. The vias V1 penetrates through the polymer layers to connect the traces T1, and the traces T1 are respectively embedded in or located on the polymer layers, and are respectively extending in or on the top surface of the polymer layers. The sidewalls of the vias V1 and the traces T1 may be straight or inclined. The cross-sectional shape of the via V1 may be square, rectangle, trapezoid, or the like, but the disclosure is not limited thereto. In some embodiments, the via V1 has inclined sidewall and is tapered toward the top surface of the carrier 10.

In some embodiments, the redistribution layer RDL1 has traces T1, the redistribution layer RDL2 has vias V1 and traces T1, the redistribution layer RDL3 has vias V1. In some other embodiments, each of the redistribution layers has vias V1 and traces T1, respectively. It is understood that, the structure of RDL structure 12 shown in FIG. 1B is merely for illustration, and the disclosure is not limited thereto.

In some embodiments, the polymer layers PM1, PM2 respectively includes a photo-sensitive material such as polybenzoxazole (PBO), polyimide (PI), benzocyclobutene (BCB), a combination thereof or the like. The forming methods of the polymer layers PM1, PM2 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3 respectively includes conductive materials. The conductive material includes metal such as copper, nickel, titanium, a combination thereof or the like, and is formed by an electroplating process. In some embodiments, the redistribution layers RDL1, RDL2, RDL3 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

Still referring to FIG. 1B, a plurality of through integrated fan-out vias (TIVs) 14 are formed on the RDL structure 12. The TIVs 14 are formed on and electrically connected to the redistribution layer RDL3. In some embodiments, the TIVs 14 include copper, nickel, solder, alloys thereof, or the like. In some embodiments, the TIV 14 includes a seed layer and a conductive layer formed thereon (not shown). The seed layer is, for example, a titanium or/and copper composited layer. The conductive layer is, for example, a copper layer. An exemplary forming method of the TIVs 14 includes the following processes: forming a seed layer on the RDL structure 12 by a sputtering process, forming a patterned photoresist layer such as a dry film resist on the seed layer over the carrier 10. Thereafter, openings are formed in the photoresist layer, the openings exposes a portion of seed layer on the top surface of the redistribution layer RDL3 and on the polymer layer PM2, and the conductive layers are then formed in the openings by electroplating. The patterned photoresist layer is stripped, and the seed layer not covered by the conductive layers is removed. As such, the conductive layer and the underlying seed layer form the TIVs 14. In some other embodiments, the TIVs 14 further include a barrier layer (not shown) under the seed layer to prevent metal diffusion. The material of the barrier layer includes, for instance, metal nitride such as titanium nitride, tantalum nitride, or a combination thereof.

Figure 1C:
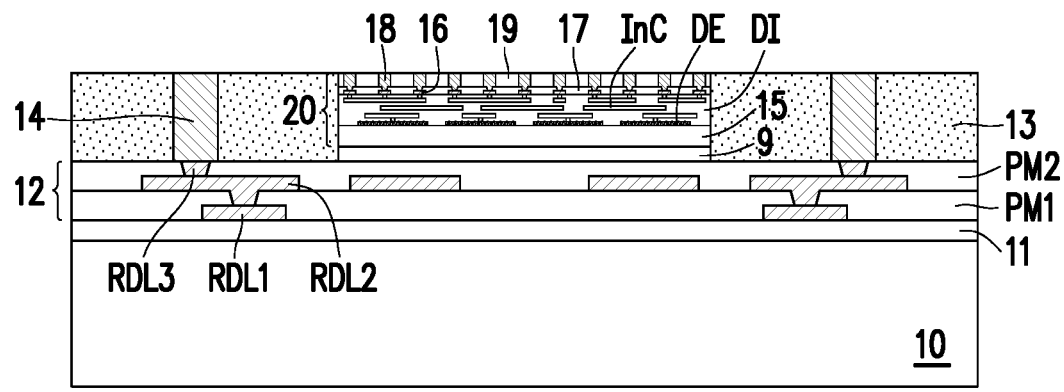

Referring to FIG. 1C, a die 20 is mounted to the RDL structure 12 over the carrier 10. In some embodiments, the die 20 is attached to the RDL structure 12 through an adhesive layer 9 such as a die attach film (DAF), silver paste, or the like. In some embodiments, the die 20 is one of a plurality of dies cut apart from a wafer, for example. The die 20 may be an application-specific integrated circuit (ASIC) chip, an analog chip, a sensor chip, a wireless and radio frequency chip, a voltage regulator chip or a memory chips. The number of the die 20 shown in FIG. 1C is merely for illustration, and the disclosure is not limited thereto. In some embodiments, two or more dies 20 may be mounted over the carrier 10, and the two or more dies 20 may be the same types of dies or the different types of dies.

Still referring to FIG. 1C, the die 20 is disposed between the TIVs 14, that is, the TIVs 14 are aside or around the die 20. In some embodiments, the die 20 includes a substrate 15, a plurality of devices DE, a dielectric structure DI, an interconnection structure InC, a plurality of pads 16, a passivation layer 17, a plurality of connectors 18 and a passivation layer 19. In some embodiments, the substrate 15 is made of silicon or other semiconductor materials. Alternatively or additionally, the substrate 15 includes other elementary semiconductor materials such as germanium, gallium arsenic, or other suitable semiconductor materials. In some embodiments, the substrate 15 may further include other features such as various doped regions, a buried layer, and/or an epitaxy layer. Moreover, in some embodiments, the substrate 15 is made of an alloy semiconductor such as silicon germanium, silicon germanium carbide, gallium arsenic phosphide, or gallium indium phosphide. Furthermore, the substrate 15 may be a semiconductor on insulator such as silicon on insulator (SOI) or silicon on sapphire.

In some embodiments, a plurality of devices DE are formed in or on the substrate 15. In some embodiments, the devices DE may be active devices, passive devices, or a combination thereof. In some embodiments, the devices DE are integrated circuit devices. The devices DE are, for example, transistors, capacitors, resistors, diodes, photodiodes, fuse devices, or the like.

In some embodiments, the interconnection structure InC and the dielectric structure DI are formed over the devices DE on the substrate 15. The interconnection structure InC is formed in the dielectric structure DI and connected to different devices DE to form a functional circuit. In some embodiments, the dielectric structure DI includes an interlayer dielectric layer (ILD) and one or more inter-metal dielectric layers (IMD). In some embodiments, the interconnection structure InC includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices DE. The via plugs are located in the IMD to be connected to the metal lines in different layers.

The pads 16 may be or electrically connected to a top conductive feature of the interconnection structure InC, and further electrically connected to the devices DE formed on the substrate 15 through the interconnection structure InC.

The material of the pads 16 may include metal or metal alloy, such as aluminum, copper, nickel, or alloys thereof.

The passivation layer 17 is formed over the substrate 15 and covers a portion of the pads 16. A portion of the pads 16 is exposed by the passivation layer 17 and serves as an external connection of the die 20. The connectors 18 are formed on and electrically connected to the pads 16 not covered by the passivation layer 17. The connector 18 includes solder bumps, gold bumps, copper bumps, copper posts, copper pillars, or the like. The passivation layer 19 is formed over the passivation layer 17 and laterally aside the connectors 18 to cover the sidewalls of the connectors 18. The passivation layers 17 and 19 respectively include an insulating material such as silicon oxide, silicon nitride, polymer, or a combination thereof. The materials of the passivation 17 and the passivation layer 19 may be the same or different. In some embodiments, the top surface of the passivation layer 19 is substantially level with the top surface of the connectors 18.

Still referring to FIG. 1C, an encapsulant 13 is then formed over the carrier 10 to encapsulate the sidewalls of the die 20 and the sidewalls of the TIVs 14. In some embodiments, the encapsulant 13 includes a molding compound, a molding underfill, a resin such as epoxy, a combination thereof, or the like. In some other embodiments, the encapsulant 13 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 13 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 13 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape.

The encapsulant 13 is formed by forming an encapsulant material layer over the carrier 10 by a suitable fabrication technique such as spin-coating, lamination, deposition, or similar processes. The encapsulant material layer encapsulates the top surfaces and sidewalls of the die 20 and the TIVs 14. Thereafter, a planarization process such as a grinding or polishing process (such as chemical mechanical polishing (CMP) process) is performed to remove a portion of the encapsulant material layer, such that the top surfaces of the connectors 18 of the die 20 and the TIVs 14 are exposed. In some embodiments, the top surfaces of the die 20, the TIVs 14 and the encapsulant 13 are substantially coplanar with each other. It is noted that, for the sake of brevity, the devices DE, the dielectric structure DI and the interconnection structure InC of the die 20 are not specifically shown in the following figures.

Figure 1D:
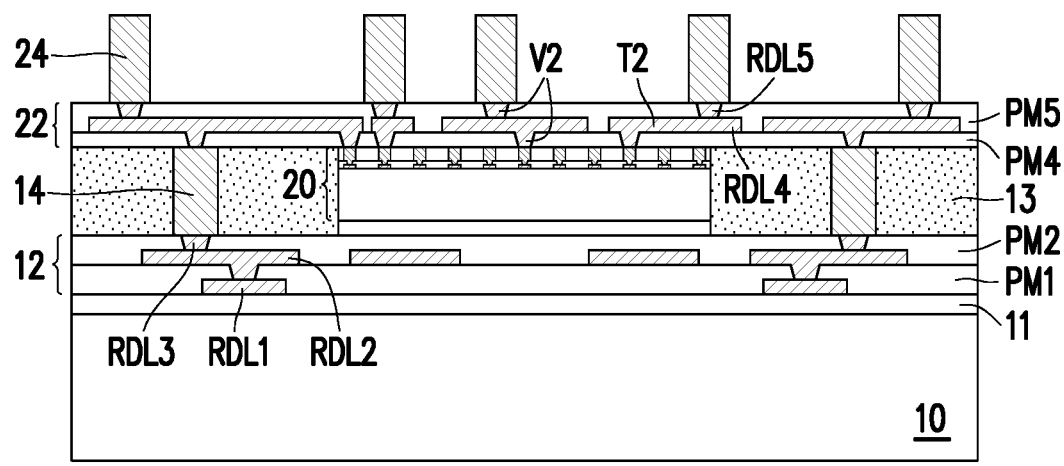

Referring to FIG. 1D, a redistribution layer (RDL) structure 22 is formed on the die 20, the TIVs 14, and the encapsulant 13. The RDL structure 22 is electrically connected to the die 20 and the TIVs 14, and further electrically connected to the RDL structure 12 through the TIVs 14. In some embodiments, the RDL structure 12 is referred to as a "back-side redistribution layer structure" and the RDL structure 22 is referred to as a "front-side redistribution layer structure". Through the specification, wherein the "front-side" refers to a side close to the connectors 18 of the die 20, and the "back-side" refers to a side opposite to the front-side and is father from the connectors 18 than the front-side.

In some embodiments, the RDL structure 22 includes a plurality of polymer layers PM4, and PM5 and a plurality of redistribution layers RDL4 and RDL5 stacked alternately. The number of the polymer layers or the redistribution layers is not limited by the disclosure.

The redistribution layer RDL4 penetrates through the polymer layer PM4 and is electrically connected to the connectors 18 of the die 20 and the TIVs 14. The redistribution layer RDL5 penetrates through the polymer layer PM5 and is electrically connected to the redistribution layer RDL4. The materials and the forming method of the polymer layers PM4, PM5 and the redistribution layers RDL4, RDL5 of the RDL structure 22 are similar to and may be the same as or different from those of the polymers layer and redistribution layers of the RDL structure 12, respectively.

In some embodiments, the redistribution layers RDL4 and RDL5 respectively includes vias V2 and traces T2 connected to each other. The vias V2 of the redistribution layer RDL4 penetrates through the polymer layer PM4 to connect the traces T2 to the TIVs 14 or the connectors 18 of the die 20. The vias V2 of the redistribution layer RDL5 penetrates through the polymer layer PM5, to connect the traces T2 of the redistribution layers RDL5 and RDL4. The traces T2 are respectively located on the polymer layers PM4 or PM5, and are respectively extending on the top surface of the polymer layers PM4 or PM5. The sidewalls of the vias V2 and the traces T2 may be straight or inclined. The cross-sectional shape of the via V2 may be square, rectangle, trapezoid, or the like, but the disclosure is not limited thereto. In some embodiments, the via V2 has inclined sidewall and is tapered toward the top surface of the die 20.

In some embodiments, the redistribution layer RDL5 is the topmost redistribution layer of the RDL structure 22, the top surface of the redistribution layer RDL5 may be coplanar with or protruding from the top surface of the polymer layer PM5.

Still referring to FIG. 1D, a plurality of TIVs 24 are formed on and electrically connected to the redistribution layer RDL5 of the RDL structure 22. The material and forming method of the TIVs 24 may selected from the same candidate materials and forming methods of the TIVs 14. The material and forming method of the TIV 24 may be the same as or different from those of the TIV 14.

Figure 1E:
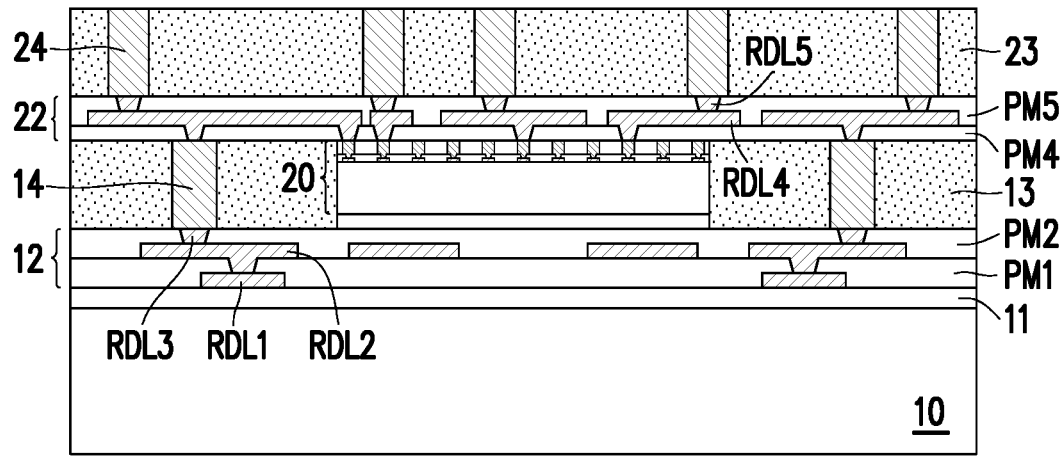

Referring to FIG. 1E, an encapsulant 23 is formed on the RDL structure 22 to encapsulates sidewalls of the TIVs 24. The material of the encapsulant 23 may be selected from the same candidate materials of the encapsulant 13, and the materials of the encapsulant 13 and the encapsulant 23 may be the same or different. In some embodiments, the encapsulant 13 may be formed by forming an encapsulant material layer on the RDL structure 22 and the TIVs 24, the encapsulant material layer covers the sidewalls and top surfaces of the TIVs 24. Thereafter, a planarization process such as a grinding process or a polishing process (such as CMP) is performed to remove a portion of the encapsulant material layer over the top surface of the TIVs 24. In some embodiments, the top surface of the encapsulant 23 and the top surfaces of the TIVs 24 are substantially coplanar with each other.

Figure 1F:
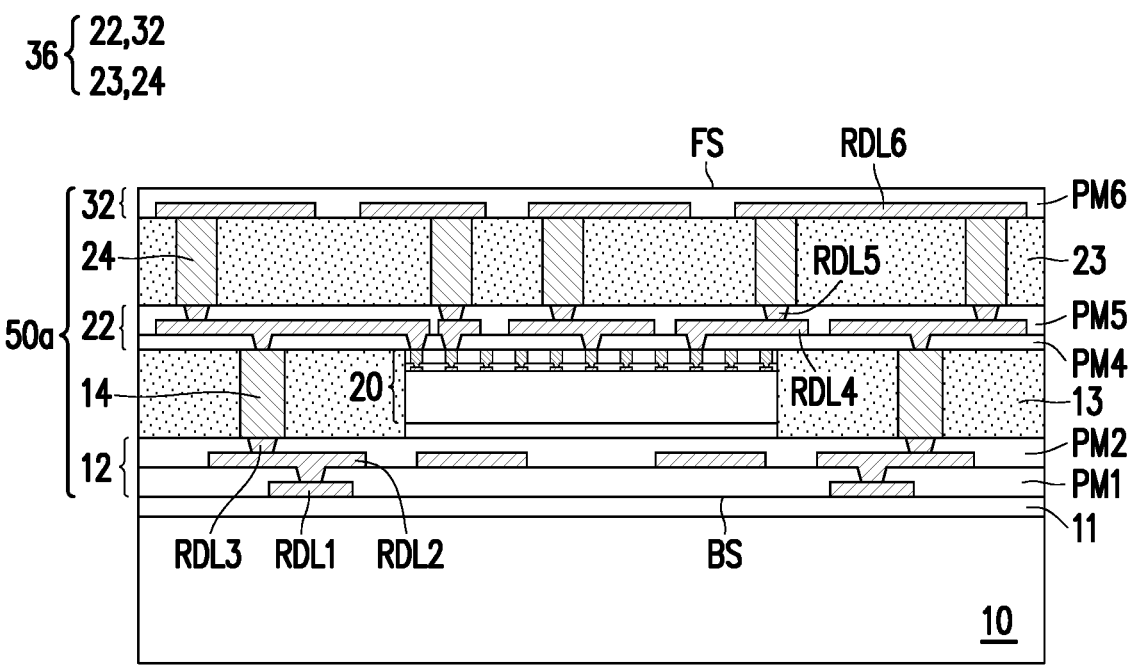

Referring to FIG. 1F, a RDL structure 32 is formed on the TIVs 24 and on the encapsulant 23. In some embodiments, the RDL structure 32 includes a redistribution layer RDL6 and a polymer layer PM6, but the disclosure is not limited thereto. In some embodiments, the RDL structure 32 may be formed by the following process: the redistribution layer RDL6 is formed on and electrically connected to the TIVs 24, and the polymer layer PM6 is then formed on the encapsulant 23 and the redistribution layer RDL6 to cover sidewalls and top surface of the redistribution layer RDL6. A planarization process is optionally performed to planarize the top surface of the polymer layer PM6. After the planarization process, the top surface of the redistribution layer RDL6 is still covered by the polymer layer PM6. The materials and forming methods of the redistribution layer RDL6 and the polymer layer PM6 are similar to, and may be the same as or different from those of the redistribution layer and polymer layer described above, respectively, and are not described here again.

In some embodiments, the RDL structure 22, the TIVs 24, the encapsulant 23, and the RDL structure 32 together constitute an antenna element 36. The antenna element 36 is electrically connected to the die 20, and is electrically connected to the back-side RDL structure 12 through the TIVs 14.

In some embodiments, a package structure 50a is thus formed over the carrier 10. The package structure 50a includes the die 20, the back side RDL structure 12, the TIVs 14, the encapsulant 23, and the antenna element 36. The package structure 50a has a first surface FS and a second surface BS. In some embodiments, the first surface FS is the surface at front-side of the die 20, and the second surface BS is the surface at back-side of the die 20. In some embodiments, the forming of the package structure 50a is referred as a first integrated fan-out (InFO) process. During the first InFO process, the second surface BS of the package structure 50a is attached to the carrier 10.

Figure 1G:
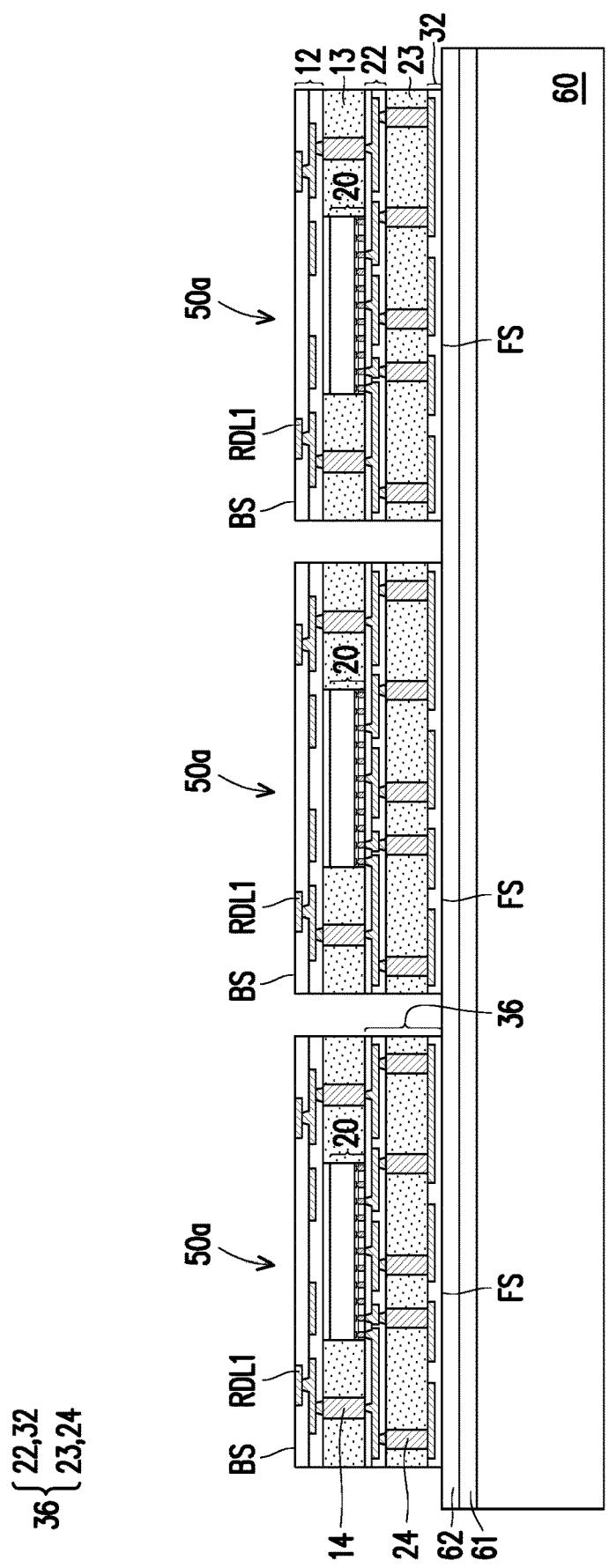

Referring to FIG. 1F to FIG. 1G, the de-bonding layer 11 is decomposed under the heat of light, and the carrier 10 is then released from the package structure 50a. The redistribution layer RDL1 of the RDL structure 12 is thus exposed for electrical connection in the subsequent process.

Figure 13:
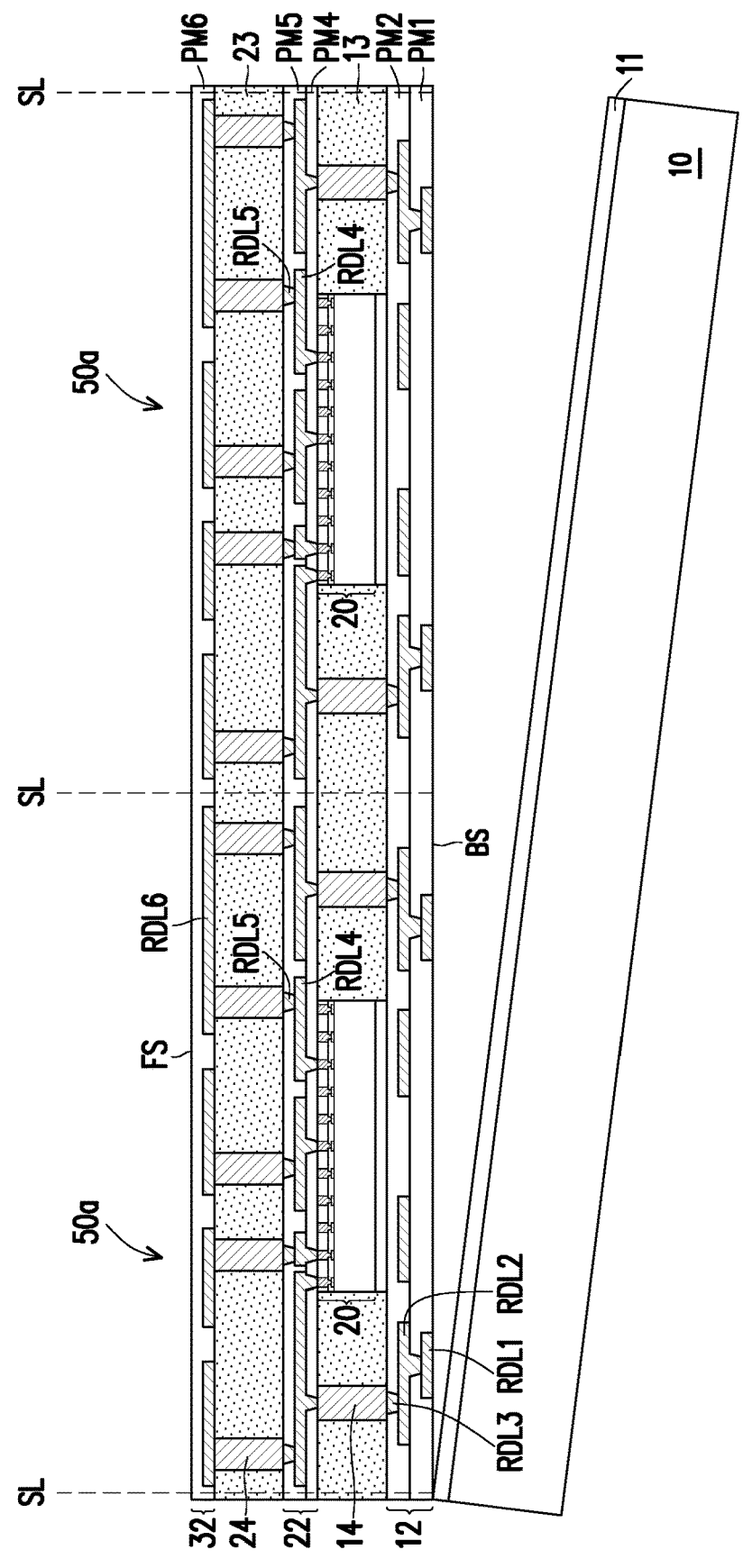
FIG. 13 is a schematic cross-sectional view illustrating a singulating process for forming a package structure according to some embodiments of the disclosure.

Referring to FIG. 13, in some embodiments in which a plurality of dies 20 are mounted to the carrier 10, after the carrier 10 is released, a singulating process such as a die-saw process is performed along the scribe line SL on the resulted structure to form a plurality of package structures 50a. In other words, the structure previously formed on the carrier 10 is sawed apart along scribe lines SL into a plurality of single package structures 50a, wherein one of package structures 50a is shown in FIG. 1F. In some embodiments, the package structure 50a includes one die 20, but the disclosure is not limited thereto. In alternative embodiments, two or more dies 20 may be included in the package structure 50a, and the number of the dies included in the package structure 50a may be adjusted depending on product design.

Referring to FIG. 1G to FIG. 1J, thereafter, a second InFO process is performed to integrate a plurality of package structures 50a into a larger scale package structure.

Referring to FIG. 1G, a carrier 60 is provided. The material of the carrier 60 may be selected from the same candidate material of the carrier 10 (FIG. 1A), and may be the same as or different from the material of the carrier 10. In some embodiments, the carrier 60 has a larger size (such as width, length, and area) than the carrier 10. The carrier 60 has a de-bonding layer 61 formed thereon. The de-bonding layer 61 is decomposable under the heat of light to thereby release the carrier 60 from the overlying structures that will be formed in subsequent steps.

A plurality of the package structures 50a are attached to the carrier 60 through adhesive layers 62 such as a die attach film (DAF), silver paste, or the like. In some embodiments, the package structure 50a is inverted, and the first surface FS of the package structure 50a is attached to carrier 60. The redistribution layer RDL1 at the second surface BS of the package structure 50a is exposed.

Figure 1H:
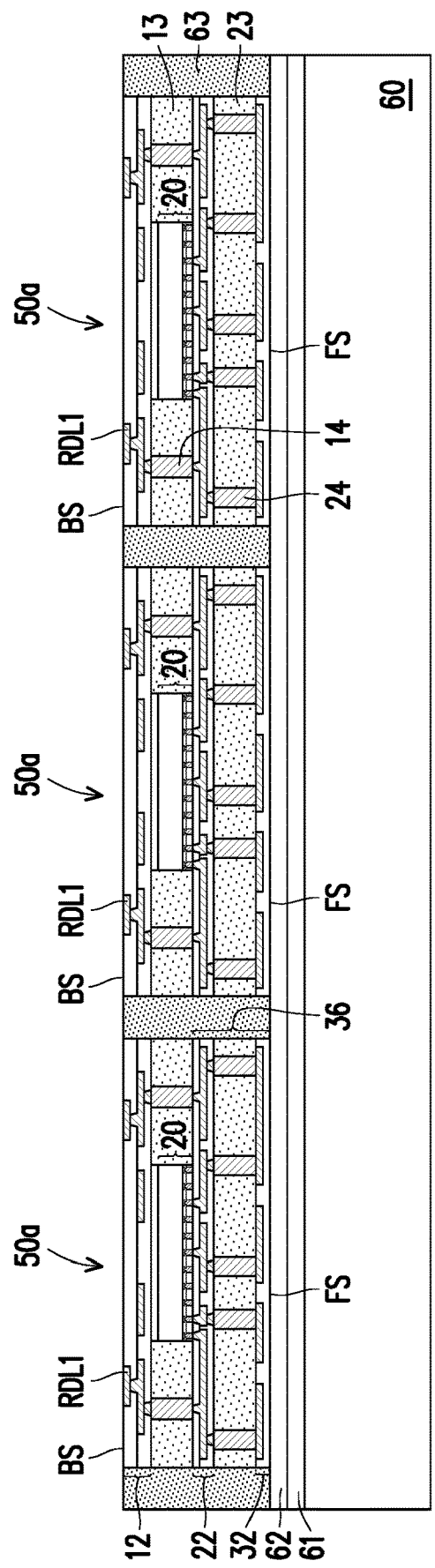

Referring to FIG. 1G and FIG. 1H, an encapsulant 63 is formed on the carrier 60 and surrounding the package structures 50a to encapsulate sidewalls of the package structures 50a. The material of the encapsulant 63 may be the same as or different from those of the encapsulant 13 or 23. In some embodiments, the encapsulant 63 includes a molding compound, a molding underfill, a resin such as epoxy, a combination thereof, or the like. In some other embodiments, the encapsulant includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant 63 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 63 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape.

The encapsulant 63 is formed by forming an encapsulant material layer over the carrier 60 by a suitable fabrication technique such as spin-coating, lamination, deposition, or similar processes. The encapsulant material layer encapsulates the second surfaces BS and sidewalls of the package structures 50a. Thereafter, a planarization process such as a grinding or a polishing process (such as CMP) is performed to remove a portion of the encapsulant material layer over the second surfaces BS of the package structures 50a, such that the top surfaces of the redistribution layers RDL1 are exposed. In some embodiments, the top surface of the encapsulant 63 is substantially coplanar with the second surfaces BS of the package structures 50a. The bottom surface of the encapsulant 63 is substantially coplanar with the first surfaces FS of the package structures 50a.

Figure 11:
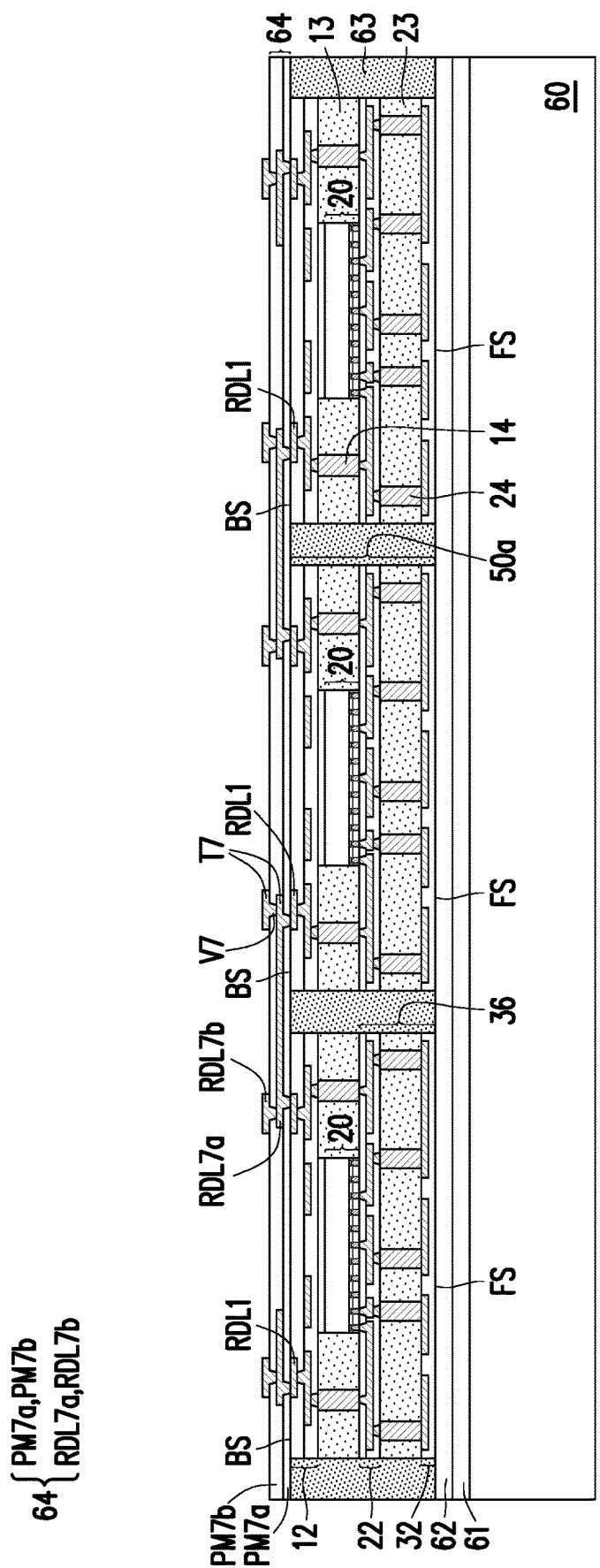
FIG. 10 to FIG. 12 respectively illustrates a top view of a package structure according to some embodiments of the disclosure.

Referring to FIG. 11, a RDL structure 64 is formed on the package structures 50a and the encapsulant 63. The RDL structure 64 is in physical contact with the RDL structures 12 of the package structures 50a and the encapsulant 63, and is electrically connected to the RDL structure 12, and further electrically connected to the die 20 and the antenna elements 36. In some embodiments, the package structures 50a are electrically connected to each other through the RDL structure 64.

In some embodiments, the RDL structure 64 includes polymer layers PM7a, PM7b and redistribution layers RDL7a, RDL7b, but the disclosure is not limited thereto. The numbers of the redistribution layers and the polymer layers are not limited.

The redistribution layer RDL7b penetrates through the polymer layer PM7b to electrically connect to the redistribution layer RDL7a. The redistribution layer RDL7a penetrates through the polymer layer PM7a and is electrically connected to the redistribution layers RDL1 of the package structures 50a. In some embodiments, the polymer layer PM7a/PM7b includes a photo-sensitive material such as polybenzoxazole (PBO), polyimide (PI), benzocyclobutene (BCB), a combination thereof or the like. In some embodiments, the redistribution layers RDL7a, RDL7b include conductive materials. The conductive materials includes metal such as copper, nickel, titanium, a combination thereof or the like, and is formed by an electroplating process. In some embodiments, the redistribution layers RDL7a, RDL7b respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL7a, RDL7b include a plurality of vias V7 and a plurality of traces T7 connected to each other. The vias V7 penetrates through the polymer layers PM7a, PM7b to connect the traces T7, and the traces T7 are located on the polymer layers PM7a, PM7b, and extending on the top surface of the polymer layers PM7a, PM7b. The sidewalls of the vias V7 and T7 may be straight or inclined, respectively. The cross-sectional shape of the via V7 may be square, rectangle, trapezoid, or the like, for example, but the disclosure is not limited thereto. In some embodiments, the via V7 have inclined sidewalls and is tapered toward the second surface BS of the package structure 50a.

Figure 1J:
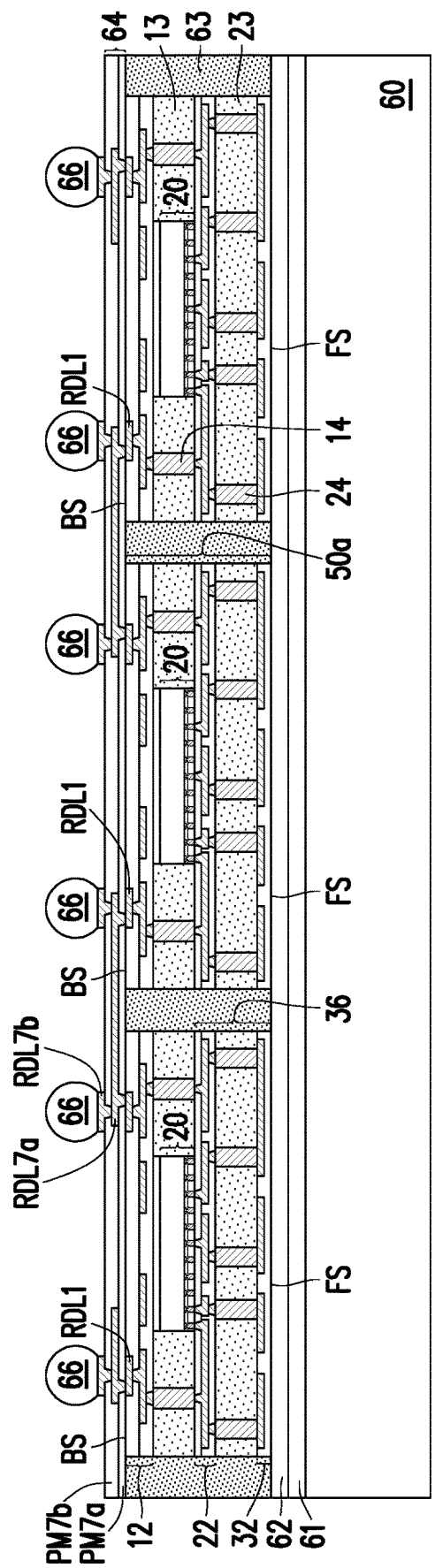

Referring to FIG. 1J, thereafter, a plurality of connectors 66 are formed on and electrically connected to the redistribution layer RDL7b of the RDL structure 64. In some embodiments, the connectors 66 are referred as conductive terminals. In some embodiments, the connectors 66 may be ball grid array (BGA) connectors, solder balls, controlled collapse chip connection (C4) bumps, or a combination thereof. In some embodiments, the material of the connector 66 includes copper, aluminum, lead-free alloys (e.g., gold, tin, silver, aluminum, or copper alloys) or lead alloys (e.g., lead-tin alloys). The connector 66 may be formed by a suitable process such as evaporation, plating, ball dropping, screen printing and reflow process, a ball mounting process or a C4 process. In some embodiments, metal posts or metal pillars may further be formed between the redistribution layer RDL7b and the connectors 66 (not shown). The connectors 66 are electrically connected to the package structures 50a through the RDL structure 64.

Figure 1K:
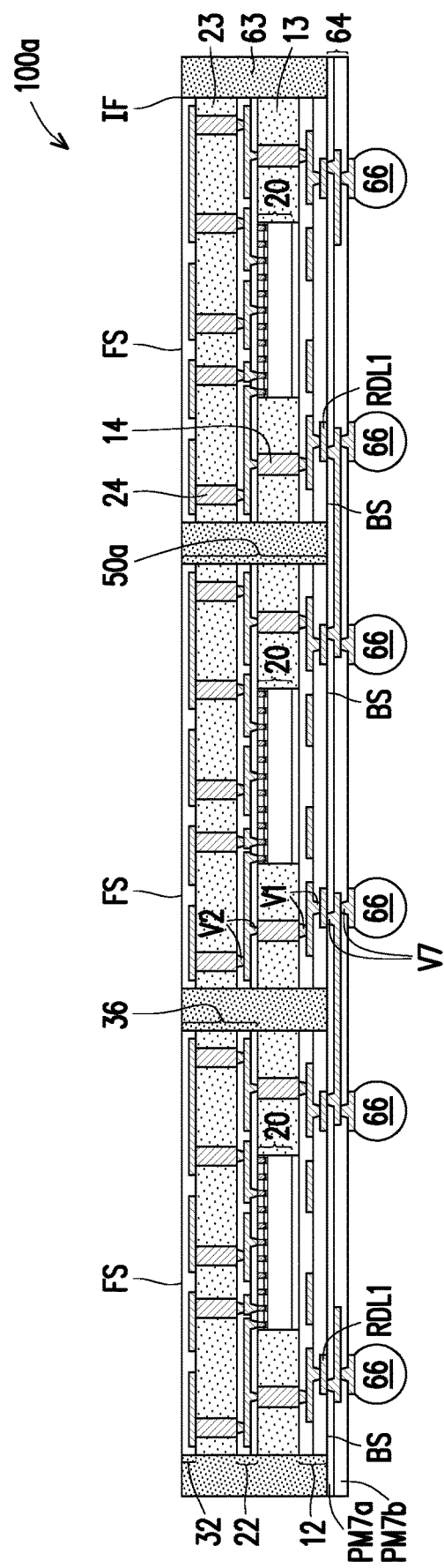

Referring to FIG. 1J and FIG. 1K, the de-bonding layer 61 is decomposed under the heat of light, and the carrier 60 is then released. In some embodiments, the adhesive layer 62 may be removed by a cleaning process, for example.

Figure 10:
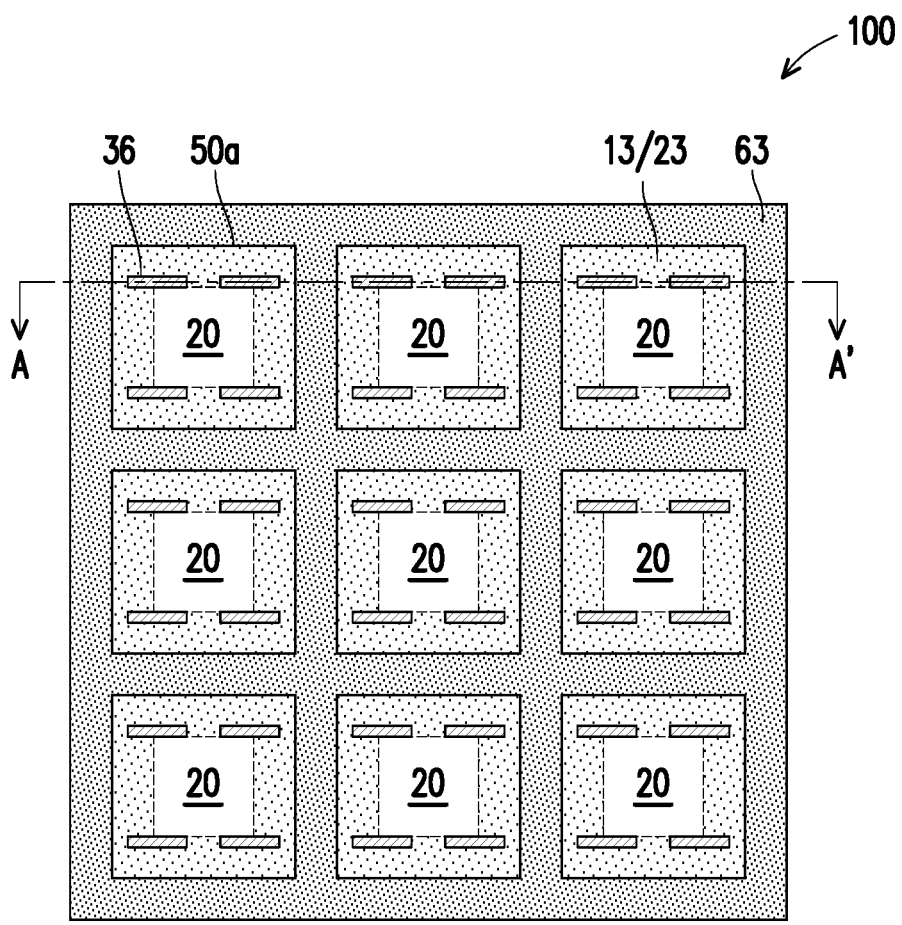
Figure 11:
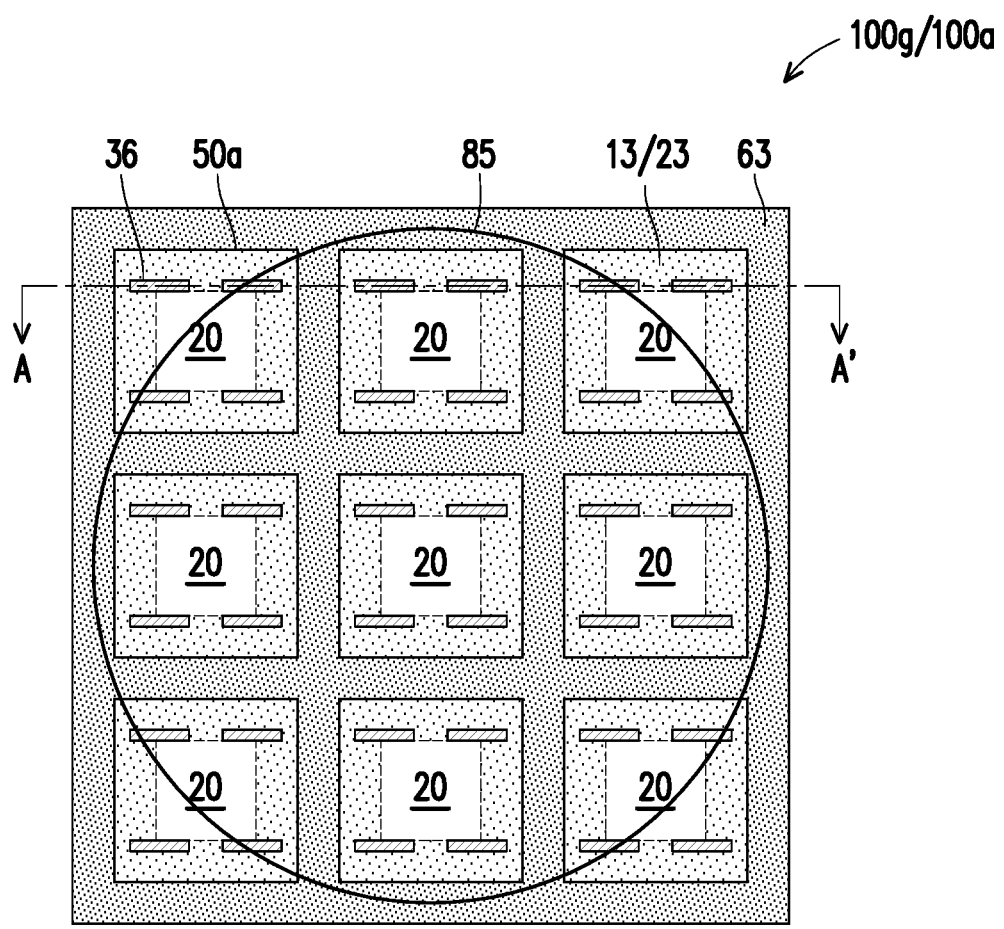

Referring to FIG. 1K, in some embodiments, a package structure 100a is thus completed. FIG. 10 illustrates a top view of the package structure 100a, and FIG. 1K is taken along line A-A' of FIG. 10. For the sake of brevity, some components of the package structure 100a are not shown in the top view FIG. 10.

Referring to FIG. 1K and FIG. 10, the package structure 100a includes a plurality of package structures 50a, the encapsulant 63, the RDL structure 64 and the connectors 66. In some embodiments, the package structure 100a is a large scale package, and the package structures 50a included therein may also be referred to as sub-package structures. In some embodiments, the area of the package structure 50a ranges from 10 mm×10 mm to 20 mm×20 mm, and the area of the package structure 100a may range from 50 mm×50 mm to 60 mm×60 mm, such as 5 cm×5 cm, for example. The ratio of the area of the sub-package structure 50a to the package structure 100a ranges from ⅕ to ⅓, for example. The package structures 50a may be arranged in an array, but the disclosure is not limited thereto. In some embodiments, the package structures 50a are electrically connected to each other through the RDL structure 64, and the sidewalls of the package structures 50a are encapsulated by the encapsulant 63. In some embodiments, the top surface of the encapsulant 63 is substantially coplanar with the first surface FS of the package structures 50a. The connectors 66 are electrically connected to the package structures 50a through the RDL structure 64.

In some embodiments, the sub-package structure 50a includes the die 20, the RDL structure 12, the TIVs 14, the encapsulant 13, and the antenna element 36. The antenna element 36 includes the RDL structure 22, the TIVs 24, the encapsulant 23 and the RDL structure 32. In some embodiments, the RDL structure 12 is at back side of the die 20. TIVs 14 are formed on the RDL structure 12 and laterally aside the die 20. The encapsulant 13 encapsulates sidewalls of the TIVs 14 and the die 20. The antenna element 36 is disposed at front side of the die 20. The encapsulant 23 of the antenna element 36 is located over the encapsulant 13, and is separated from the encapsulant 13 by the RDL structure 22 therebetween. In some embodiments, sidewalls of the encapsulant 13 are aligned with the sidewalls of the encapsulant 23, but the disclosure is not limited thereto.

Still referring to FIG. 1K, the sidewalls of the package structures 50a are encapsulated by the encapsulant 63. Specifically, the sidewalls of the RDL structure 12, the encapsulant 13, the RDL structure 22, the encapsulant 23, and the RDL structure 32 are encapsulated by the encapsulant 63. In some embodiments, a first surface (top surface) of the encapsulant 63 is substantially coplanar with the first surfaces FS of the package structures 50a. A second surface (bottom surface) of the encapsulant 63 is in contact with the RDL structure 64, and is substantially coplanar with the second surfaces BS of the package structures 50a. The materials of the encapsulant 13, 23 and 63 may be the same as or different from each other. The material or structure of the RDL structure 12, 22, 32 and 64 may be the same or different.

Interfaces IF are existed between the encapsulant 63 and the package structure 50a. In some embodiments in which the encapsulants 13, 23 and 63 respectively includes a base material and fillers, a portion of the interface IF between the encapsulant 13 and the encapsulant 63 or between the encapsulant 23 and the encapsulant 63 is illustrated in the enlarged view FIG. 14.

Figure 14:
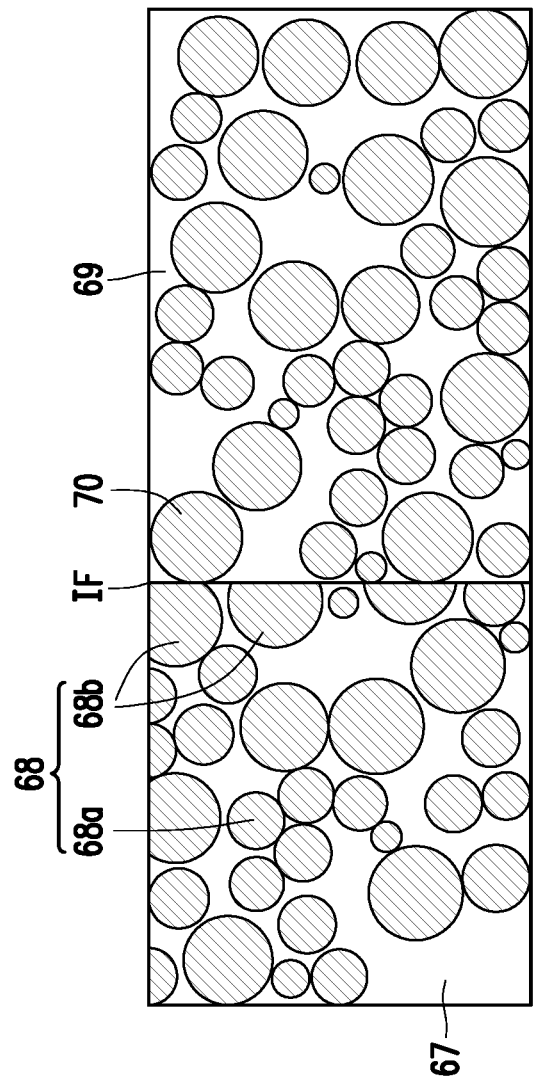
FIG. 14 is an enlarged cross-sectional view illustrating an encapsulant of a sub-package structure and an encapsulant of a package structure including the sub-package structure according to some embodiments of the disclosure.

Referring to FIG. 1K and FIG. 14. In some embodiments, the encapsulant 13 or 23 includes a base material 67 and fillers 68 in the base material 67. The encapsulant 63 includes a base material 69 and fillers 70 in the base material 69. In some embodiments, the fillers 68 and the fillers 70 are spherical particles. In some embodiments, since the encapsulant 13 and the encapsulant 23 were subjected to a singulation process to form the package structure 50a (FIG. 13), some of the fillers 68 at the sidewalls of the encapsulant 13 or 23 may be cut and partially removed. Also, the filler 68 at top surface of the encapsulant 13 or 23 may also be cut and partially removed because of the planarization process. As a result, the fillers 68 includes fillers 68a and 68b distributed in the base material 67. The fillers 68a are farther from the sidewalls and top surface of the base material 67. The fillers 68b are distributed at top surface or sidewalls of the base material 67.

In some embodiments, the surface of the filler 68a is rounded or curved, while a portion of the surface of the filler 68b is rounded, and another portion of the surface of the filler 68b is flat. In some embodiments, the portion of the fillers 68b contacting with the encapsulant 63 has a flat surface. In other words, the portions of encapsulant 13 or 23 in contact with the encapsulant 63 have been cut and planarized in the step shown in FIG. 13. Accordingly, the spherical particles 68b in contact with encapsulant 63 are partially cut during the singulating process, and hence will have substantially planar surfaces (rather than rounded surfaces) in contact with encapsulant 63. As a comparison, since no planarization or singulating process is performed on the surface of the encapsulant 63 in contact with the encapsulant 13 or 23, the fillers 70 of the encapsulant 63 have rounded surface in contact with the encapsulant 13 or 23.

Still referring to FIG. 1K, in some embodiments, the package structure 100a includes multiple RDL structures, such as the RDL structure 12, the RDL structure 22, the RDL structure 32 and the RDL structure 64. The RDL structures 12, 22, and 32 are formed during the first InFO process and included in the sub-package structures 50a, while the RDL structure 64 is formed during the second InFO process to connect the sub-package structures 50a. The area of the RDL structure 64 is larger than the area of the RDL structures 12, 22, 32 (or the area of the sub-package structure 50a) when projected to a surface parallel with the top surface of the die 20, respectively.

As illustrated in FIG. 1K, the RDL structures 12, 22, 32 are located over the second surface BS of the sub-package structure 50a, and the RDL structure 64 is located below the second surface BS of the sub-package structure 50a. In other words, the RDL structures 12, 22, 32 and the RDL structure 64 are located at opposite sides of the second surface BS of the sub-package structure 50a. In some embodiments, the vias V1, V2 of the RDL structures 12, 22 and the vias V7 of the RDL structure 64 are located at opposite sides of the second surface BS of the sub-package structure 50a, and are tapered toward the second surface BS of the sub-package structures 50a. In other words, the via V1 and V2 are tapered toward the connector 66, while the via V7 is tapered away from the connector 66. That is to say, the via V1 and the via V2 are tapered toward a same direction, the via V1 and the via V7 are tapered toward different directions.

Referring to FIG. 10, in some embodiments, the antenna elements 36 of the die 20 are included in the sub-package structures 50a and arranged in an array in the package structure 100a. In some embodiments, the package structures 50a are arranged in a high density array. In the embodiments of the disclosure, a large antenna array is achieved by packing multiple sub-package structures into a large scale package structure.

FIG. 2A to FIG. 2G are schematic cross-sectional views illustrating a method of forming a package structure according to a second embodiment of the disclosure. The second embodiment differs from the first embodiment in that the sub-package structure further includes connectors 54 formed on the RDL structure 12.

Figure 2A:
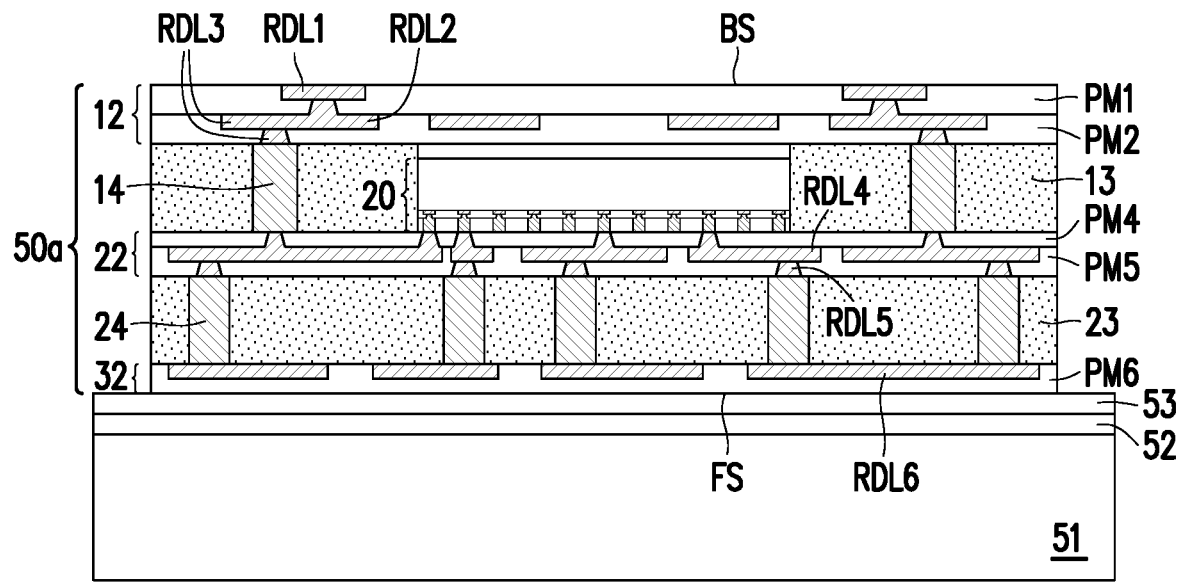
FIG. 2A to FIG. 2G are schematic cross-sectional views illustrating a method of forming a package structure according to a second embodiment of the disclosure.

Referring to FIG. 1F (FIG. 13) and FIG. 2A, in some embodiments, after the package structure 50a is formed. A carrier 51 is provided. In some embodiments, the carrier 51 has a de-bonding layer 52 formed thereon. The first surface FS of the package structure 50a is attached to the carrier 51 through an adhesive layer 53 or placed on the carrier 51. The redistribution layer RDL1 of the RDL structure 12 at the second surface BS of the package structure 50a is thus exposed.

Figure 2B:
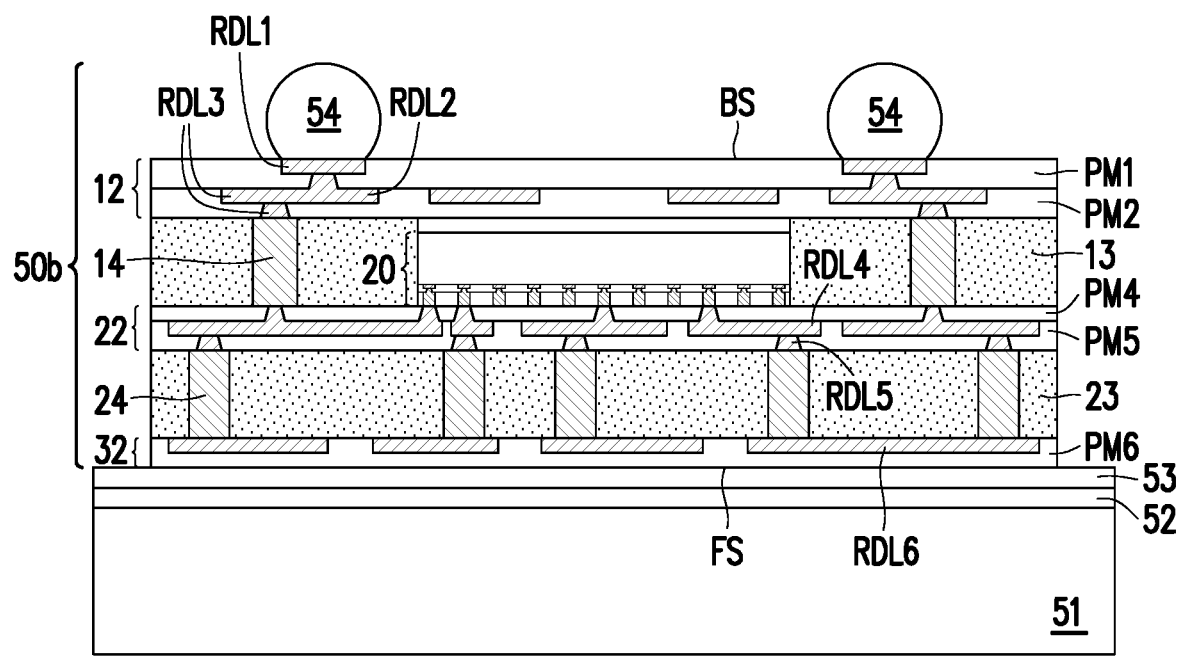

Referring to FIG. 2A to FIG. 2B, in some embodiments, a plurality of connectors 54 are formed on and electrically connected to the redistribution layer RDL1 of the RDL structure 12. The connectors 54 may be referred to as the connective terminals of the package structure 50b. The material and forming method of the connector 54 is similar to, and may be the same as or different from those of the connector 66 (FIG. 1J), and are not described again.

Referring to FIG. 2B, as such, a package structure 50b is formed on the carrier 51. The package structure 50b is similar to the package structure 50a, except the package structure 50b further includes the connectors 54. Thereafter, the carrier 51 is released from the package structure 50b through the decomposition of the de-bonding layer 52, the adhesive layer 53 may be removed by a cleaning process.

In some embodiments, the singulating process shown in FIG. 13 is performed after the connectors 54 are formed. For example, the structure (FIG. 2A) attached to the carrier 51 includes a plurality of package structures 50a connected to each other, and the connectors 54 are formed on the RDL structures 12 of the plurality of package structures 50a, to form a plurality of package structures 50b connected to each other. Thereafter, the carrier 51 is released, and the plurality of package structures 50b are sawed apart along scribe lines therebetween, such that the package structures 50b are singulated, and one of the package structures 50b is shown in FIG. 2B.

As such, the first InFO process is completed and the sub-package structure 50b is formed. Thereafter, a plurality of singulated package structures 50b are packed into a large scale package structure through a second InFO process.

Figure 2C:
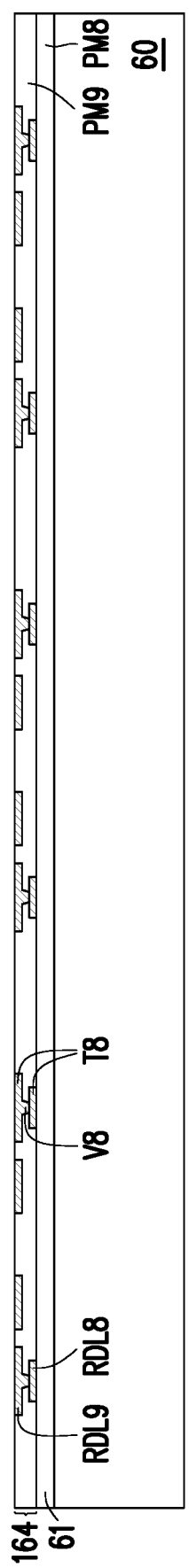

Referring to FIG. 2C, a carrier 60 having a de-bonding layer 161 thereon is provided, and a RDL structure 164 is formed on the carrier 60. In some embodiments, the RDL structure 164 includes the polymer layers PM8, PM9 and the redistribution layers RDL8, RDL9, but the disclosure is not limited thereto. The materials and forming methods of the polymer layers PM8, PM9 and the redistribution layers RDL8, RDL9 are similar to, and may be the same as or different those of the polymer layers and redistribution layers described above.

In some embodiments, the RDL structure 164 includes vias V8 and traces T8 connected to each other. The sidewalls of the vias V8 and the traces T8 may be straight or inclined. The cross-sectional shape of the via V8 may be square, rectangle, trapezoid, or the like, but the disclosure is not limited thereto. In some embodiments, the via V8 has inclined sidewall and is tapered toward the top surface of the carrier 60.

Figure 2D:
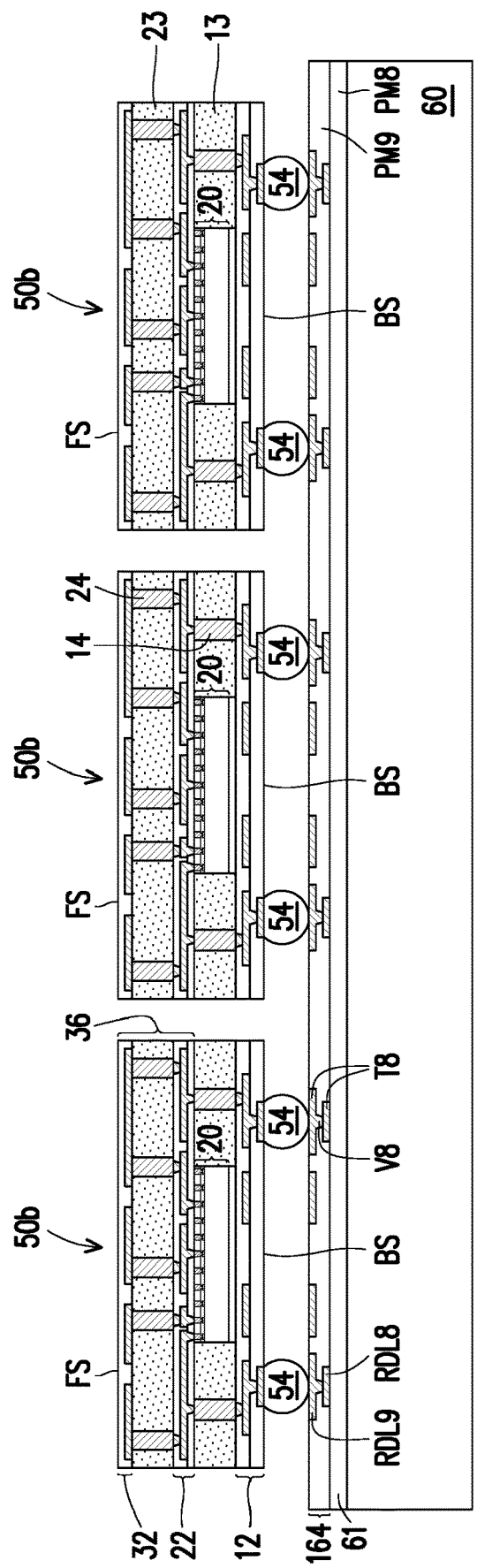

Referring to FIG. 2B to FIG. 2D, after the carrier 51 is released from the package structure 50, a plurality of the package structures 50b are connected or bonded to the RDL structure 164 through the connectors 54. In some embodiments, the package structures 50b are inverted, and the connectors 54 are aligned with and placed on the redistribution layer RDL9 of the RDL structure 164. Thereafter, a reflow process may be performed on the connectors 54, such that the package structures 50b are bonded to the redistribution layer RDL9 through the connectors 54. The RDL structure 164 and the RDL structure 12 of the package structure 50b are spaced from each other by the connectors 54.

Figure 2E:
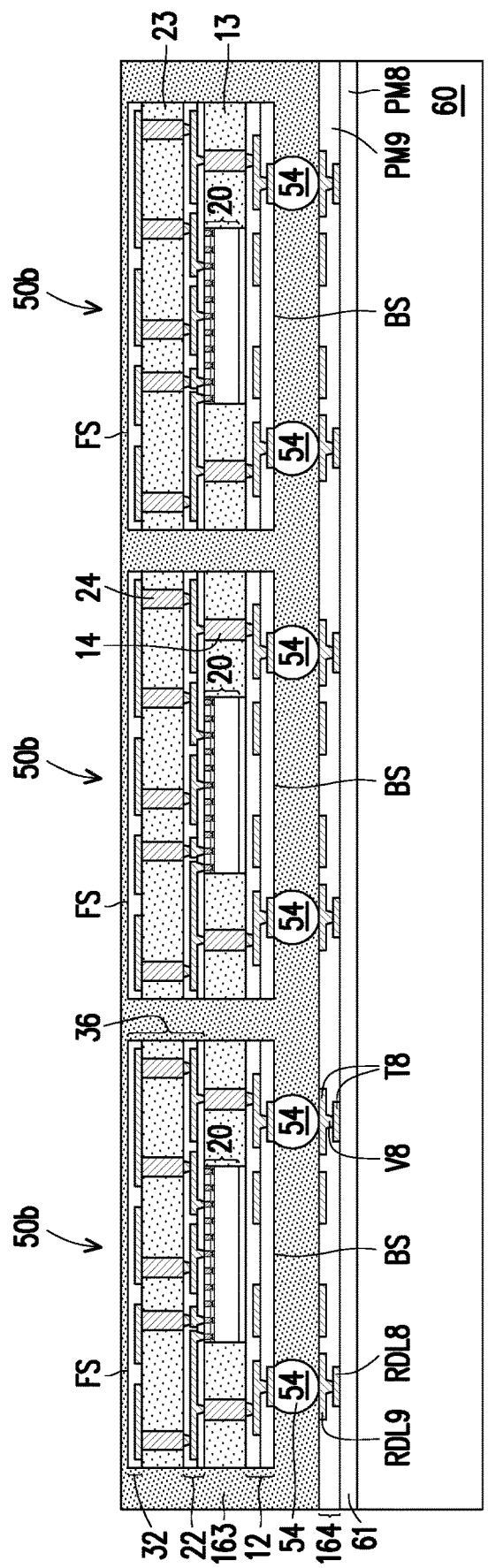

Referring to FIG. 2E, an encapsulant 163 is formed on the RDL structure 164 to encapsulate the package structures 50b. The material of the encapsulant 163 is similar to, and may be the same as or different from that of the encapsulant 63 (FIG. 1H). In some embodiments, the encapsulant 163 may be formed by the following processes: an encapsulant material layer is formed on the RDL structure 164 by a suitable fabrication technique such as spin-coating, lamination, deposition, molding process or similar processes.

Thereafter, a planarization process such as a grinding or a polishing process (such as CMP) may be performed to planarize the top surface of the encapsulant 163. In some embodiments, the planarization process is omitted.

Still referring to FIG. 2E, the encapsulant 163 surrounds and encapsulates the sidewalls of the package structures 50a, and fills into the space between the RDL structures 12 of the package structures 50a and the RDL structure 164, and surrounds the connectors 54. The top surface of the encapsulant 163 may be level with or higher than the first surfaces FS of the package structures 50a. The bottom surface of the encapsulant 163 is in contact with the RDL structure 164, and is lower than the second surfaces BS of the package structures 50a. In other words, the first surfaces FS of the package structures 50a may be encapsulated by the encapsulant 163 or exposed, the second surfaces BS of the package structures are encapsulated by the encapsulant 163, but the disclosure is not limited thereto.

Figure 2F:
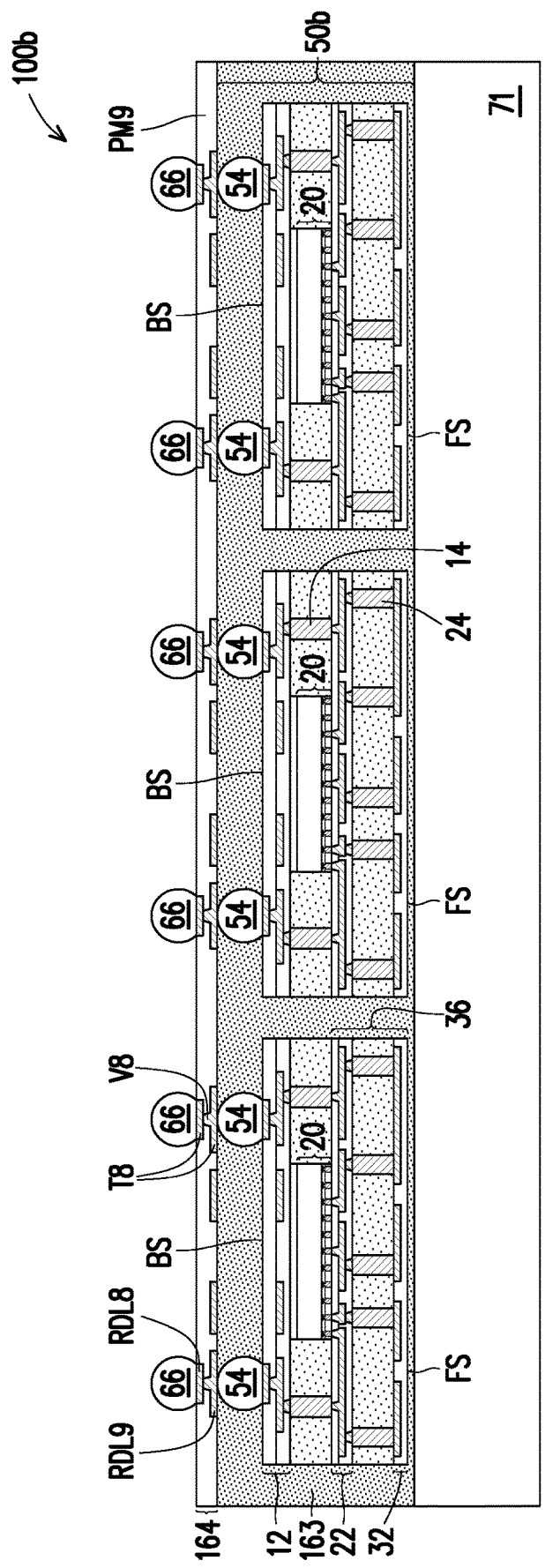

Referring to FIG. 2E to FIG. 2F, the de-bonding layer 61 is decomposed, and the carrier 60 is released from the overlying structure. The structure on the carrier 60 shown in FIG. 2E is inverted and placed or attached to a carrier 71. In some embodiments, the carrier 71 may be referred to as a holder. The carrier 71 may also have a de-bonding layer formed thereon, and structure may be attached to the carrier 71 through an adhesive layer, but the disclosure is not limited thereto.

Referring to FIG. 2F, the redistribution layer RDL8 of the RDL structure 164 is exposed, and a plurality of connectors 66 are formed on and electrically connected to the redistribution layer RDL8. The material and forming method of the connectors 66 are similar to, and may be the same as or different from those described in FIG. 1J of the first embodiment. The connectors 66 and the connectors 54 may be the same types of connectors or different types of connectors. As such, a package structure 100b is thus formed.

Figure 2G:
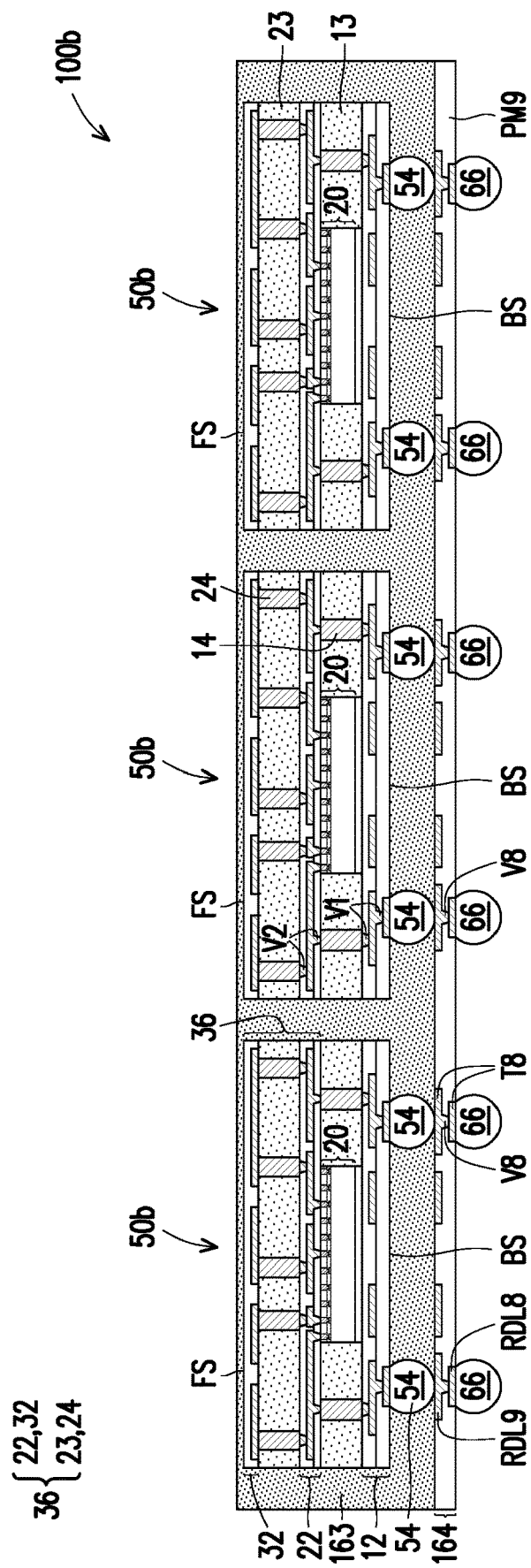

Referring to FIG. 2F to FIG. 2G, the carrier 71 is then released from the package structure 100b. Referring to FIG. 2G, in some embodiments, the package structure 100b includes a plurality of sub-package structure 50b, the encapsulant 163, the RDL structure 164 and the connectors 66. In some embodiments, the encapsulant 163 encapsulates the sidewalls, the second surfaces BS, or/and the first surfaces FS of the sub-package structures 50b. A portion of the encapsulant 163 is disposed between the sub-package structures 50b and the RDL structure 164. However, the disclosure is not limited thereto.

In some embodiments, the sub-package structure 50b includes the die 20, the RDL structure 12, the TIVs 14, the encapsulant 13, and the antenna element 36. The antenna element 36 is formed on front side of the die 20, and the RDL structure 12 is formed on back side of the die 20. The RDL structure 12 is adjacent to the RDL structure 164 and spaced from the RDL structure 164 by the connectors 54 and the encapsulant 163 therebetween. The RDL structure 164 has a larger area than the RDL structure 12 or the antenna element 36 or the sub-package structures 50a. In some embodiments, the via V1 of the RDL structure 12 and the via V8 of the RDL structure 164 are located at opposite sides of the second surface BS of the package structures 50a, and are tapered toward a same direction. In some embodiments, both the via V1 and the via V8 are tapered toward the connector 66. The other features of the package structure 100b are similar to those of the package structure 100a, which are not described again.

FIG. 3 to FIG. 9 respectively illustrates a package structure according to some other embodiments of the disclosure. These package structures are similar to the package structure 100a or 100b and further include some modification. The following description will focus on the difference between theses package structures and the package structure 100a or 100b.

Figure 3:
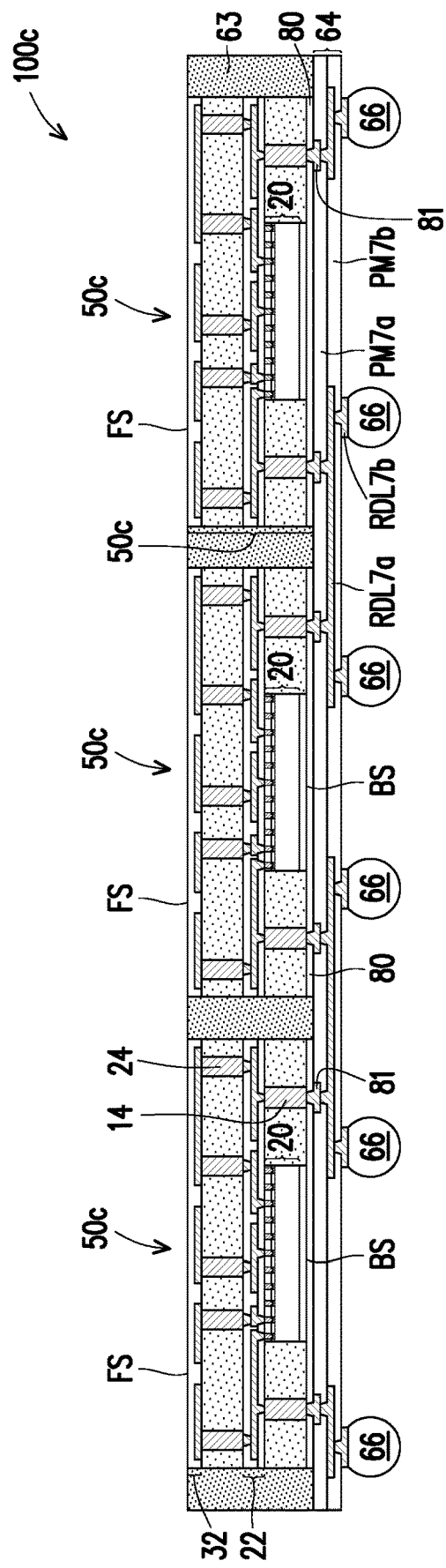
FIG. 3 to FIG. 9 respectively illustrates a package structure according to some embodiments of the disclosure.

Referring to FIG. 3, a package structure 100c including the sub-package structures 50c, the encapsulant 63, the RDL structure 64 and the connectors 66 is illustrated. The package structure 100c is similar to the package structure 100a except that the sub-package structures 50c are free of the back-side RDL structure 12 and includes a dielectric layer 80 at the position of the back-side RDL structure 12, and the TIVs 14 of the package structures 50c are electrically connected to the RDL structure 64 through connectors 81.

Referring to FIG. 1B and FIG. 3, in some embodiments, the step of forming the RDL structure 12 is replaced by forming the dielectric layer 80. The dielectric layer 80 may include a polymer, such as PBO, PI, BCB, or the like or combinations thereof. Thereafter, before forming the RDL structure 64 (FIG. 1I), a patterning process such as a laser drilling process may be performed on the dielectric layer 80, so as to form openings in the dielectric layer 80 exposing the TIVs 14. Connectors 81 are formed in the openings to electrically connect to the TIVs 14. The connectors 81 may include solder bumps, gold bumps, copper bumps, copper posts, copper pillars, or the like. Thereafter, the RDL structure 64 is formed on the package structures 50c and the connectors 81, and connectors 66 are formed. In some embodiments, the polymer layer PM7a covers a portion of sidewalls of the connectors 81. The redistribution layer RDL7a of the RDL structure 64 is electrically connected to the connectors 81.

Figure 4:
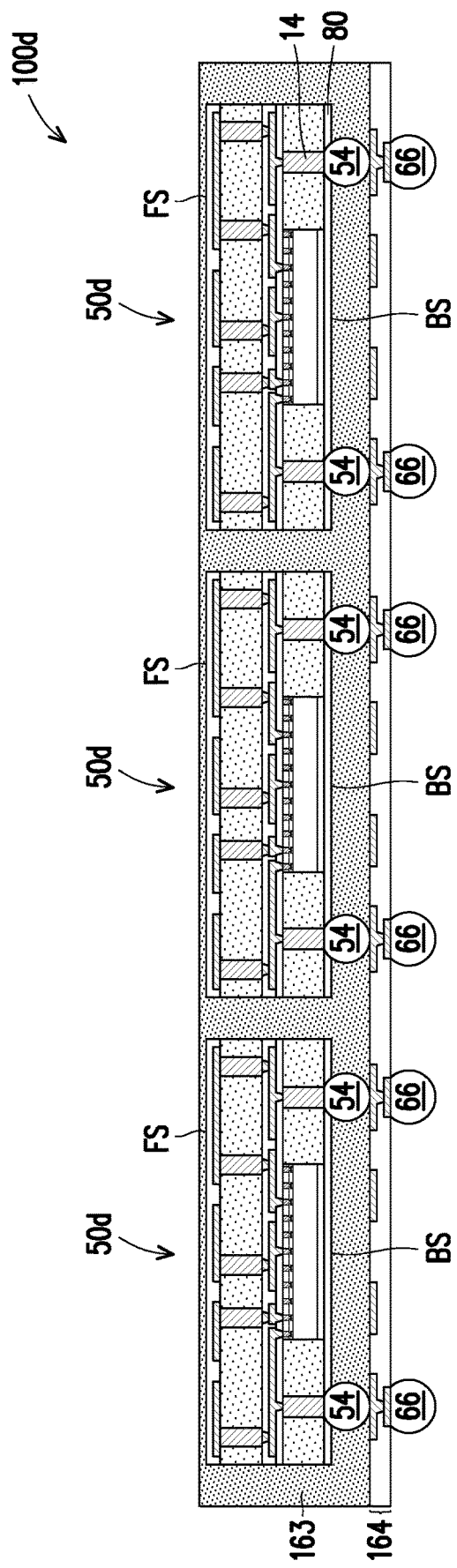

Referring to FIG. 4, a package structure 100d including sub-package structures 50d, the encapsulant 163, the RDL structure 164 and the connectors 66 is illustrated. The package structure 100d is similar to the package structure 100b, except that the sub-package structures 50d are free of the RDL structures 12 and include the dielectric layer 80 at the position of the RDL structure 12 comparing to the sub-package structures 50b. In some embodiments, the dielectric layer 80 includes openings exposing the TIVs 14, and the connectors 54 fill into the openings of the dielectric layer 80 to electrically connect the TIVs 14 of the package structure 50d to the RDL structure 164. The encapsulant 163 encapsulates sidewalls, the second surfaces BS or/and the first surfaces FS of the package structures 50d, and fill into the space between dielectric layer 80 (that is, the second surface BS of the package structure 50d) and the RDL structure 164 to cover bottom surfaces of the dielectric layer 80 and top surface of the RDL structure 164 and surround the connectors 54.

Figure 5:
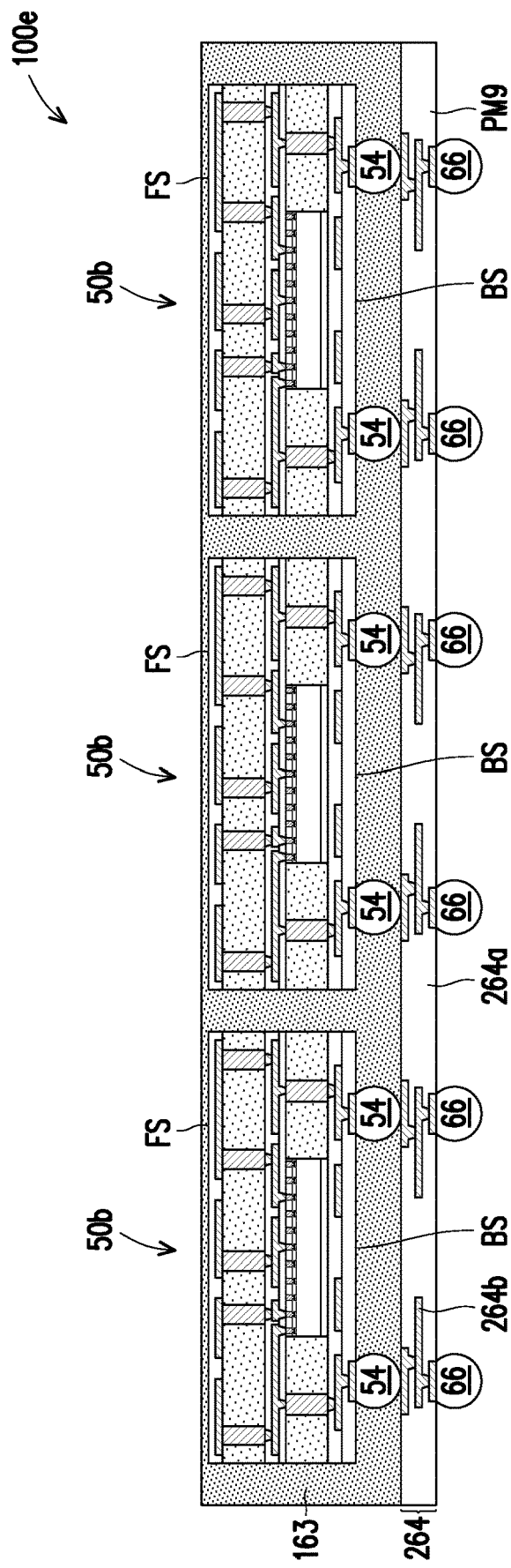

Referring to FIG. 5, a package structure 100e including package structures 50b, the encapsulant 163, the substrate 264, and the connectors 66 is illustrated. The package structure 100d is similar to the package structure 100b, except that the RDL structure 164 is replaced by the substrate 264. Referring to FIG. 2C and FIG. 5, in some embodiments, the substrate 264 may be pre-formed before attached to the carrier 60. The substrate 264 includes dielectric layer 264a and the multi-layers of conductive lines 264b formed in the dielectric layer 264a. The number of the layers of conductive lines 264b is not limited to that is shown in FIG. 5. In some embodiments, the materials of the dielectric layer 264a and the conductive lines 264b are similar to, the same as or different from those of the polymer layer and redistribution layer of the RDL structure 164, respectively. The package structures 50b are electrically connected to each other through the conductive lines 264b of the substrate 264. The connectors 66 are electrically connected to the package structures 50b through the substrate 264. It is noted that, the RDL structure 164 of package structure 100d may also be replaced by the substrate 264.

Figure 6:
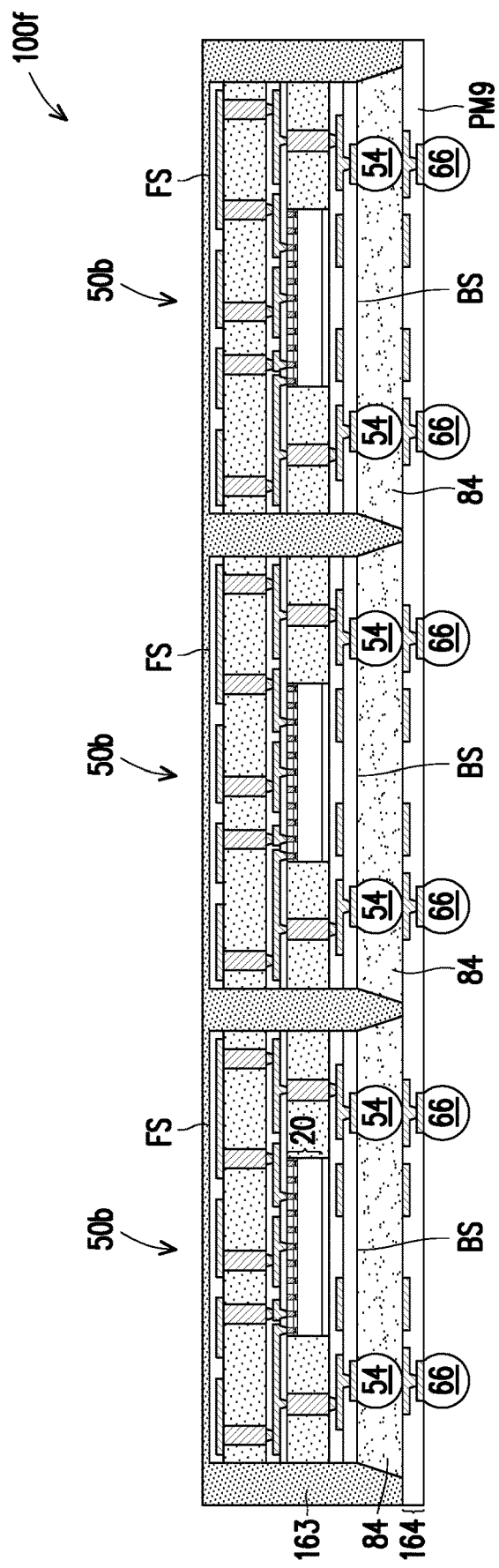

Referring to FIG. 6, a package structure 100f including the sub-package structures 50b, the encapsulant 163, underfill layers 84, the RDL structure 164 and the connectors 66 is illustrated. The package structure 100f is similar to the package structure 100b except that the package structure 100f further includes the underfill layers 84.

Referring to FIG. 2D and FIG. 6, in some embodiments, after the sub-package structures 50b are bonded to the RDL structure 164 and before the encapsulant 163 is formed, underfill layers 84 are formed to fill the space between the sub-package structures 50b and the RDL structure 164. The underfill layer 84 covers the second surface BS of the package structure 50b and a portion of the top surface of the RDL structure 164 and surrounds the connectors 54. The sidewalls of the underfill layer 84 may be straight or inclined. In some embodiments, the sidewalls of the underfill layer 84 may be aligned with the sidewalls of the package structure 50b, but the disclosure is not limited thereto. The encapsulant 163 is formed after the underfill layers 84 are formed. The encapsulant 163 is located on the RDL structure 164, and encapsulates sidewalls or/and first surfaces FS of the sub-package structures 50b and sidewalls of the underfill layers 84. The connectors 54 are separated from the encapsulant 163 by the underfill layer 84 therebetween.

Figure 7:
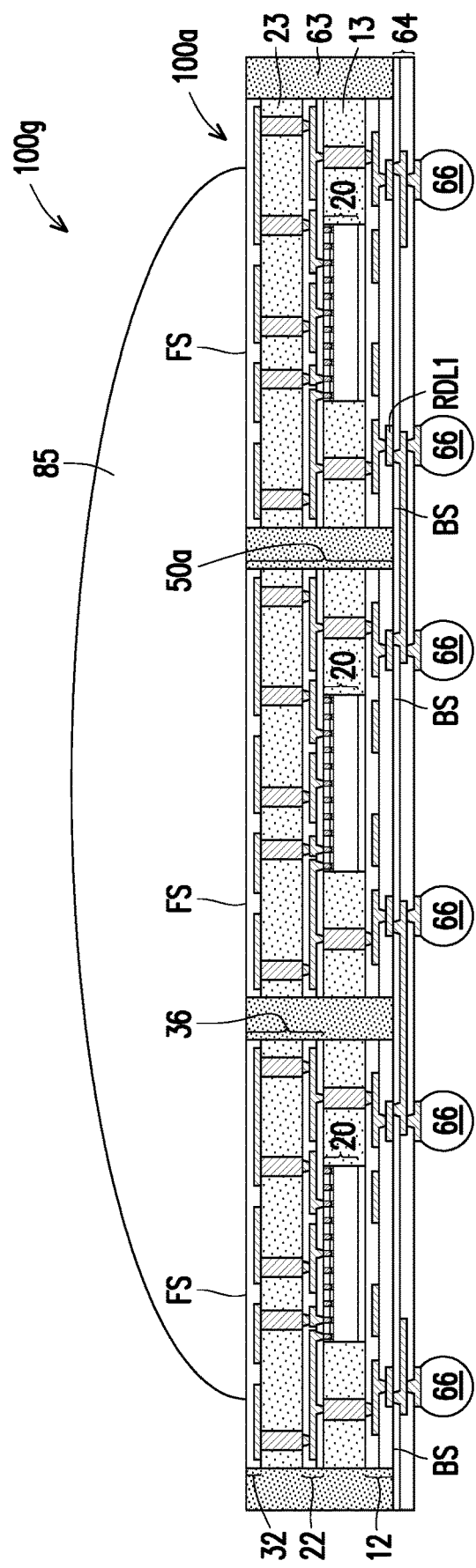

Referring to FIG. 7, a package structure 100g including the package structure 100a and a lens 85 is illustrated. FIG. 11 is a top view of the package structure 100g, and FIG. 7 is taken along line A-A' of FIG. 11. In some embodiments, after the package structure 100a is formed, a lens 85 is disposed on the package structure 100a. The lens 85 are disposed on the first surfaces FS of the package structures 50a and adjacent to the antenna elements 36 of the package structure 100a. In some embodiments, the lens 85 is attached to the package structure 100a through an adhesive layer (not shown), but the disclosure is not limited thereto. The lens 85 may be transparent or opaque. The material of the lens 85 may include, silicon, glass, or the like, or other suitable material, or combinations thereof, and the disclosure is not limited thereto. The material of the lens 85 may be selected depending on the power or signal radiated or transmitted by the antenna elements 36. The lens 85 direct and focus the radiation from the antenna elements 36 toward specific radiation-sensing regions. In some embodiments, the power or signal radiated or transmitted by the antenna elements 36 may become more concentrated through the lens 85, and thus the performance of antenna elements 36 is improved.

Referring to FIG. 7 and FIG. 11, in some embodiments, the cross-sectional shape of the lens 85 maybe arced or the like, and the shape of the lens 85 in top view is circular, but the disclosure is not limited thereto. In some embodiments, in the top view, the shape of the package structure 100a is square, rectangle, or the like, and the shape of the lens 85 is circular, the lens 85 is located within a region directly over the package structure 100a. As such, the lens 85 covers a portion of the top surface of the package structure 100a, and portions of the sub-package structures 50a at corners of the package structure 100a may be not covered by the lens 85. The lens 85 may be positioned in various arrangements and have various shapes depending on a refractive index of a material used for the lens 85.

Figure 8:
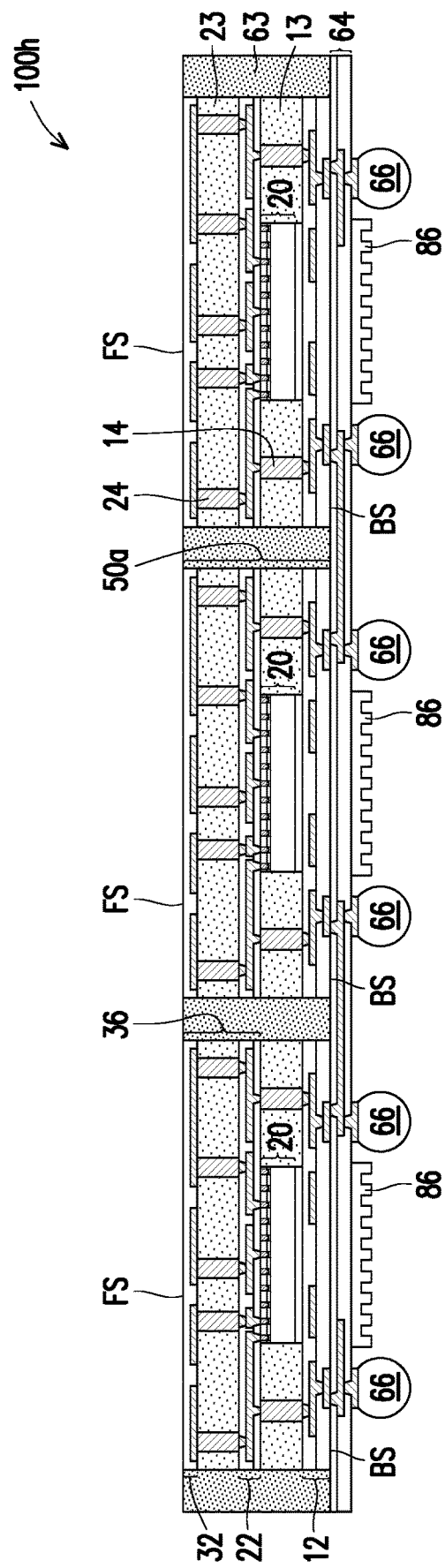

Referring to FIG. 8, a package structure 100h including the package structures 50a, the encapsulant 63, the RDL structure 64, the connectors 66 and the heat sinks 86 is illustrated. The package structure 100h is similar to the package structure 100a except that the package structure 100h further includes the heat sinks 86 for heat dissipation.

The heat sink 86 may be formed before or after forming the connectors 66. The heat sink 86 is formed on the RDL structure 64 over the sub-package structures 50a. In some embodiments, the heat sink 86 is in physical contact with the RDL structure 64. The heat sink 86 may be in contact with the redistribution layer of the RDL structure 64, the polymer layer of the RDL structure 64, or combinations thereof. The heat sink 86 is made of a material with a high coefficient of thermal conductivity, and is used to dissipate the heat generated from the package structure 100a (the dies 20). In some embodiments, the material of the heat sink 86 may include copper, silver, gold, tungsten, aluminum, steel, combinations thereof or the like, but the disclosure is not limited thereto. The heat sink 86 may be formed by any suitable material as long as the heat sink 86 effectively conducts heat away from the package structure 100a.

In some embodiments, the heat sink 86 may be bonded to the redistribution layer of the RDL structure 64 through a metal-to-metal bonding process, and is electrically connected to the RDL structure 64, but the disclosure is not limited thereto. In some other embodiments, the heat sink 86 may be attached to the RDL structure 64 and is floating, that is, the heat sink 86 may be not electrically connected to other components of the package structure 100a.

Figure 9:
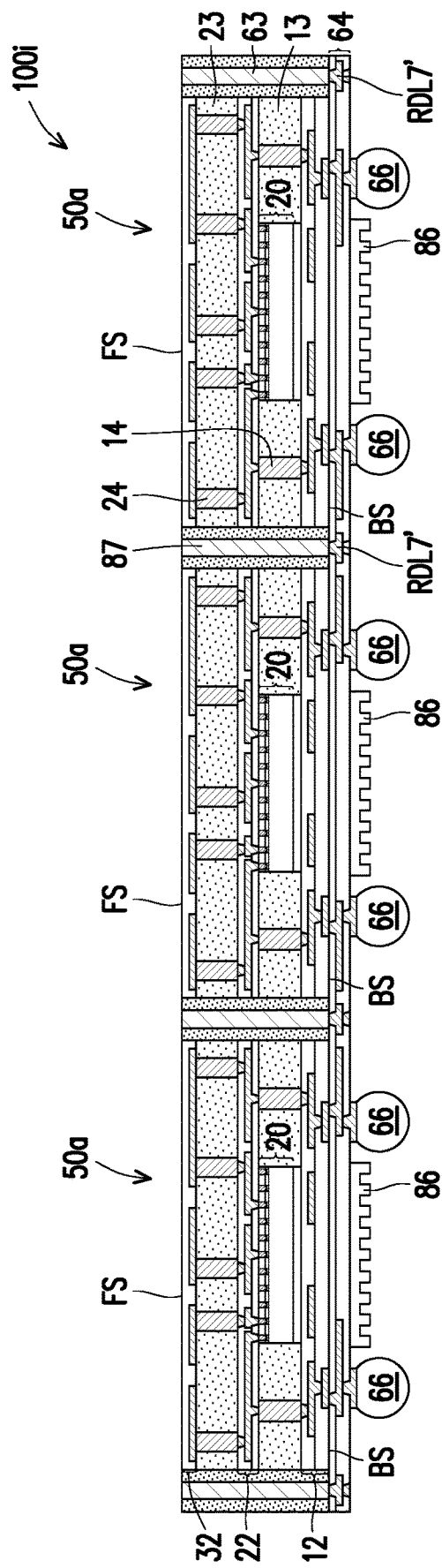

In some embodiments, the cross sectional shape of the heat sink 86 may be comb-shaped, as shown in FIG. 9, but the disclosure is not limited thereto. In some other embodiments, the heat sink 86 may be plate or sheet shaped or any other shaped, and the cross-sectional shape of the heat sink 86 may be square, rectangle, trapezoid or other suitable shape. In some embodiments, the number of the heat sink 86 is equal to the number of the sub-package structure 50a included in the package structure 100h, but the disclosure is not limited thereto. In some other embodiments, the number of the heat sink 86 may be larger than or less than the number of the sub-package structures 50a, as long as the heat of the package structure 100a is effectively dissipated.

Referring to FIG. 9, a package structure 100i including the package structures 50a, the encapsulant 63, the RDL structure 64, the connectors 66, the heat sinks 86 and the TIVs 87 is illustrated. The package structure 100i is similar to the package structure 100h except that the package structure 100i further includes TIVs 87. The TIVs 87 may be formed before forming the encapsulant 63. The material of the TIV 87 may be similar to, the same as or different from those of the TIV described above.

Figure 12:
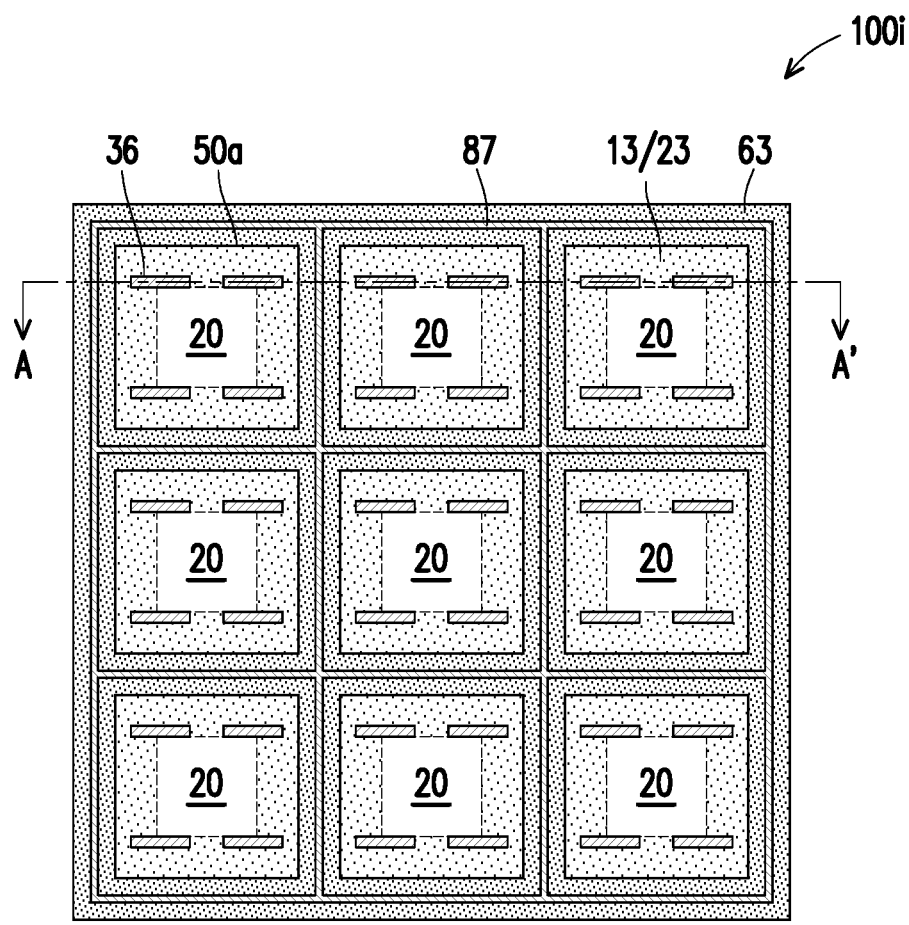

FIG. 12 is a top view of the package structure 100i. Referring to FIG. 9 and FIG. 12, in some embodiments, the TIVs 87 form a plurality of rings surrounding the sub-package structures 50a. The sidewalls of the TIVs 87 are encapsulated by the encapsulant 63. In some embodiments, the TIVs 87 are grounded TIVs. The RDL structure 64 may further include redistribution layers RDL7' formed on and electrically connected to the TIVs 87. The TIVs 87 may help to isolate the sub-package structures 50a from each other to avoid the interference between the antenna elements 36 of different sub-package structures 50a. In other word, the sub-package structures 50a are surrounded by the TIVs 87, and are isolated from each other by the TIVs 87.

It is noted that, the lens 85 (FIG. 7), the heat sink 86 (FIG. 8), or the TIV 87 (FIG. 9) or combinations thereof may be applied to any of the package structures (100a-100i) described in the foregoing embodiments.

In the foregoing embodiments, two InFO processes are performed to achieve the large scale package. However, the disclosure is not limited thereto. In alternative embodiments, merely one InFO process is needed to achieve the large scale package. For example, in the first InFO process described above, a plurality of dies are electrically connected to each other through the RDL structure, so as to form a large scale package structure. In some embodiments, multiple dies are mounted over the carrier 10 (FIG. 1C) in the first InFO process, and the multiple dies may be divided into several regions (such as 4 regions), each region includes a plurality of dies, and the plurality of dies are electrically connected to each other through the RDL structure. After the first InFO process is completed and conductive terminals 54 are formed (FIG. 2B), a singulating process similar to that described in FIG. 13 is performed to singulate the several regions, and each singulated region is a large scale package includes a plurality of dies connected to each other. In some embodiments, all the dies mounted over the carrier are connected to each other to form a large scale package.

Figure 15:
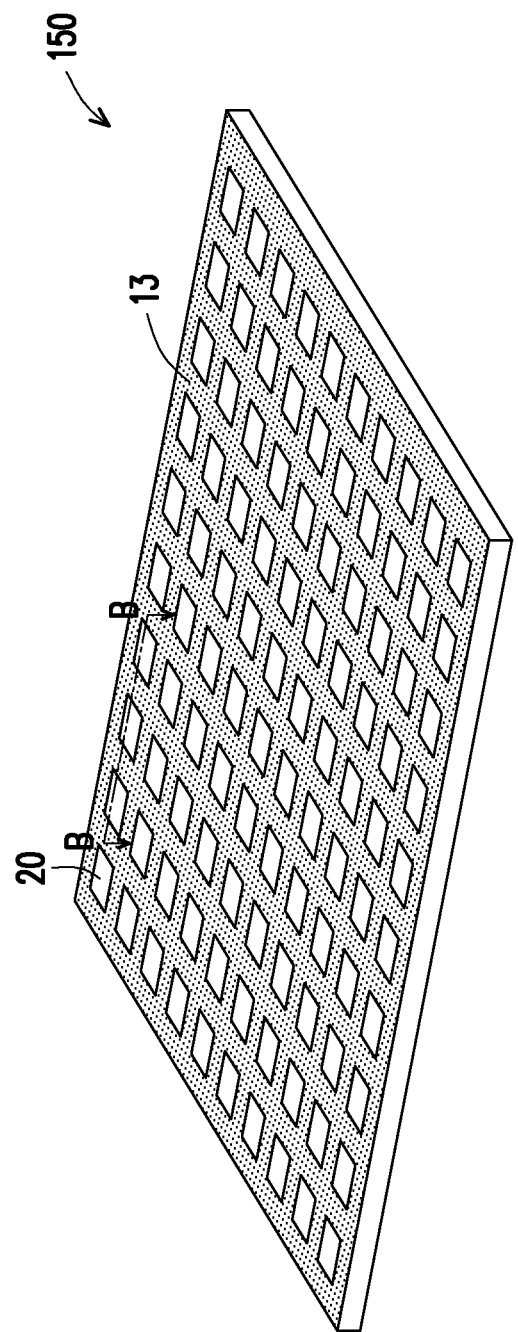
FIG. 15 is a top view of a large scale package formed by one InFO process according to some embodiments of the disclosure.
Figure 16:
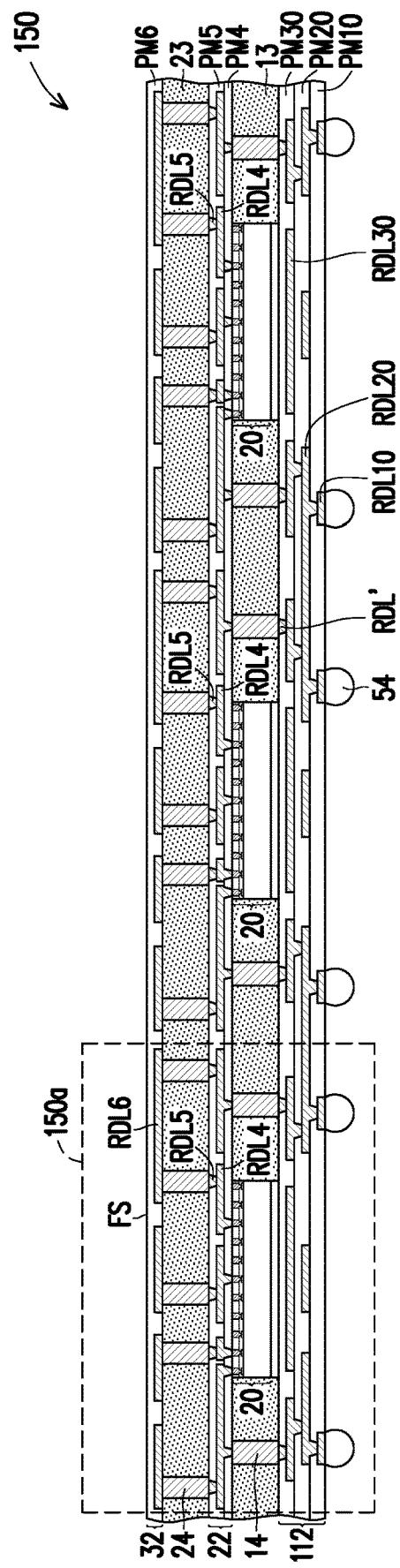
FIG. 16 is a schematic cross-sectional view taken along B-B line of FIG. 15.

FIG. 15 is a top view of a large scale package formed by one InFO process according to some embodiments of the disclosure. FIG. 16 is a schematic cross-sectional view along B-B line of FIG. 15. It is noted that, for the sake of brevity, the antenna elements over the dies are not specifically shown in the top view FIG. 15.

Referring to FIG. 15 and FIG. 16, a package structure 150 is illustrated. The package structure 150 is similar to the package structure 50b (FIG. 2B), except that the package structure 150 is a large scale package including much more dies 20 than the package structure 50b. For example, the package structure 150 includes a lot of dies 20, a back side RDL structure 112, the TIVs 14, the encapsulant 13, the antenna element 36 and the connectors 54. The dies 20 may be arranged in an array, for example. Each die 20 include antenna elements 36, such that the package structure 150 includes a large antenna array. In other words, the package structure 150 includes a plurality of sub-package unit 150a, each sub-package unit 150a includes one die 20, and the plurality of sub-package units 150a are interconnected to each other through the RDL structure 112.

In some embodiments, the dies 20 are electrically connected to each other through the RDL structure 22, the TIVs 14 and the RDL structure 112. For example, the RDL structure 112 may include the polymer layers PM10, PM20, PM30 and the redistribution layers RDL10, RDL20, RDL30 and RDL' stacked alternately. The redistribution layers of the RDL structure 112 are interconnected to each other, so as to electrically connect the dies 20 to each other. In some embodiments, the number of the dies 20 included in the package structure 150 ranges from 50 to 60, for example. The area of the package structure 150 may be in the same range as the package structure 100a (FIG. 1K) described above. However, the disclosure is not limited thereto.

In the disclosure of the embodiments, in some embodiments, multi sub-package structures each including antennas are packed into a single package structure. The single package structure has a very large scale and includes a high density package array. In alternative embodiments, a package structure includes a lot of dies connected to each other, and each die includes antennas. As such, a very large antenna array is achieved, and narrow beamwidth may be achieved by the vary large antenna array. Steering beams of the very large antenna array enables an ultra-narrow, steerable beam across wide degree. In some embodiments, the large antenna array maybe applied to a sensing system, and the sensing system with the large antenna array can have narrow beamwidth to achieve finer spatial resolution, and thus generating high definition image. In addition, comparing to realizing a large antenna array in a single die or chip which is high cost, the present disclosure is a cost effective way to realize the large antenna array.

In accordance with some embodiments of the disclosure, a package structure includes a plurality of sub-package structures, a second encapsulant, a second RDL structure and a second conductive terminal. The sub-package structure includes a die, first TIVs, a first encapsulant and an antenna element. The die has a first side and a second side. The first TIVs are laterally aside the die. The first encapsulant encapsulates sidewalls of the die and sidewalls of the TIVs. The antenna element is on the first side of the die, and on the TIVs and the first encapsulant. The second encapsulant encapsulates sidewalls of the sub-package structures. The second RDL structure is electrically connected to the plurality of sub-package structures. The second conductive terminal is electrically connected to the sub-package structures through the second RDL structure.

In accordance with some embodiments of the disclosure, a package structure includes a plurality of sub-package structures having antenna elements, an encapsulant, a RDL structure and a conductive terminal. The encapsulant encapsulates sidewalls of the sub-package structures. The RDL structure is on the sub-package structures and on the encapsulant, and is electrically connected to the plurality of sub-package structures. The conductive terminal is electrically connected to the sub-package structures through the RDL structure.

In accordance with some embodiments of the disclosure, a method of forming a package structure includes the following steps. A first integrated fan-out (InFO) process is performed to form a plurality of sub-package structures. A second InFO process is performed to pack the sub-package structures into the package structure. The first InFO process includes the following steps. A first TIV is formed aside a die on a first RDL structure. A first encapsulant is formed to encapsulate sidewalls of the TIV and sidewalls of the die. An antenna element is formed on the die, the first TIV and the first encapsulant. The second InFO process includes the following steps. A second encapsulant is formed to encapsulate sidewalls of the sub-package structures. A second RDL structure is formed. Electrically connect the second RDL structure to the sub-package structures. A conductive terminal is formed and is electrically connect to the sub-package structures through the second RDL structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
 a plurality of sub-package structures, the sub-package structure comprising:
 a die having a first side and a second side;
 first through integrated vias (TIVs) laterally aside the die;

a first encapsulant, encapsulating sidewalls of the die and sidewalls of the TIVs; and
an antenna element on the first side of the die, and on the TIVs and the first encapsulant;
a second encapsulant, encapsulating sidewalls of the sub-package structures, wherein a top surface of the second encapsulant is coplanar with a top surface of the antenna element; and
a second RDL structure electrically connected to the plurality of sub-package structures; and
a second conductive terminal, electrically connected to the sub-package structures through the second RDL structure,
wherein the first encapsulant comprises a first base material and first fillers; the second encapsulant comprises a second base material and second fillers; and one of the first fillers contacting with the second encapsulant has a flat surface.

2. The package structure of claim 1, wherein sidewalls of the first encapsulant are encapsulated by the second encapsulant.

3. The package structure of claim 1, wherein
one of the second fillers contacting with the first encapsulant has a rounded surface.

4. The package structure of claim 1, wherein the sub-package structure further comprises a first RDL structure disposed on the second side of the die, the first RDL structure is between the die and the second RDL structure.

5. The package structure of claim 4, wherein the second RDL structure has a larger area than the first RDL structure.

6. The package structure of claim 1, wherein the sub-package structure further comprises a dielectric layer disposed on the second side of the die and between the die and the second RDL structure, the second RDL structure is electrically connected to the first TIVs through a connector penetrating through the dielectric layer.

7. The package structure of claim 1, wherein the sub-package structure further comprises a first conductive terminal on the second side of the die and electrically connected to the first TIVs and the second RDL structure.

8. The package structure of claim 1, wherein the second encapsulant is in contact with sidewalls of the antenna element and the first encapsulant.

9. The package structure of claim 7, wherein the second encapsulant further fills into the space between the sub-package structures and the second RDL structure and surrounds the first conductive terminal.

10. The package structure of claim 7, further comprising underfill layers filling the space between the sub-package structures and the second RDL structure, and the encapsulant further encapsulates sidewalls of the underfill layers.

11. The package structure of claim 1, further comprising a lens on the sub-package structures and adjacent to the antenna elements of the sub-package structures.

12. The package structure of claim 1, further comprising heat sinks disposed on the second RDL structure for heat dissipation.

13. The package structure of claim 1, further comprising a second TIV surrounding the sub-package structures, and the second encapsulant further encapsulates sidewalls of the second TIV.

14. A package structure, comprising:
a plurality of sub-package structures having antenna elements, wherein one of the antenna elements comprises a conductive feature and a first encapsulant encapsulating sidewalls of the conductive feature,
a second encapsulant, encapsulating sidewalls of the sub-package structures, wherein a top surface of the second encapsulant is coplanar with a top surface of the antenna element;
a RDL structure on the sub-package structures and on the second encapsulant, electrically connected to the plurality of sub-package structures; and
a conductive terminal, electrically connected to the sub-package structures through the RDL structure,
wherein the first encapsulant comprises a first base material and first fillers; the second encapsulant comprises a second base material and second fillers; and one of the first fillers contacting with the second encapsulant has a flat surface.

15. The package structure of claim 14, wherein the second encapsulant is in contact with sidewalls of the antenna element.

16. The package structure of claim 14, wherein the second encapsulant further encapsulates bottom surfaces of the sub-package structures and a portion of a top surface of the RDL structure.

17. The package structure of claim 14, wherein the sub-package structures are arranged in an array.

18. A method of forming a package structure, comprising:
performing a first integrated fan-out (InFO) process to form a plurality of sub-package structures, comprising:
forming a first TIV aside a die on a first RDL structure;
forming a first encapsulant, encapsulating sidewalls of the TIV and sidewalls of the die;
forming an antenna element on the die, the first TIV and the first encapsulant; and
performing a second InFO process to pack the sub-package structures into the package structure, comprising:
forming a second encapsulant, encapsulating sidewalls of the sub-package structures;
forming a second RDL structure, and electrically connecting the second RDL structure to the sub-package structures; and
forming a conductive terminal, electrically connected to the sub-package structures through the second RDL structure.

19. The method of claim 18, wherein the second RDL structure is formed after the second encapsulant is formed.

20. The method of claim 18, wherein the electrically connecting the second RDL structure to the sub-package structures comprises performing a bonding process, and the second encapsulant is formed after the bonding process is performed.

* * * * *